US012707740B2

(12) United States Patent
Hanaoka et al.

(10) Patent No.: US 12,707,740 B2
(45) Date of Patent: Aug. 11, 2026

(54) SEMICONDUCTOR PACKAGE AND METHOD FOR MANUFACTURING SEMICONDUCTOR PACKAGE

(71) Applicant: SONY SEMICONDUCTOR SOLUTIONS CORPORATION, Kanagawa (JP)

(72) Inventors: Shunsaku Hanaoka, Kumamoto (JP); Takuya Nakamura, Kanagawa (JP); Shumpei Aoki, Kanagawa (JP); Yukihide Keigo, Kumamoto (JP); Eiichirou Kishida, Kumamoto (JP); Ayaka Seki, Kumamoto (JP); Yuji Hara, Kumamoto (JP); Seigi Ono, Kumamoto (JP); Junki Komori, Kumamoto (JP); Takayuki Tanaka, Kumamoto (JP); Tomohiko Baba, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 379 days.

(21) Appl. No.: 18/551,244

(22) PCT Filed: Dec. 28, 2021

(86) PCT No.: PCT/JP2021/048819

§ 371 (c)(1),
(2) Date: Sep. 19, 2023

(87) PCT Pub. No.: WO2022/201726

PCT Pub. Date: Sep. 29, 2022

(65) Prior Publication Data

US 2024/0170512 A1 May 23, 2024

(30) Foreign Application Priority Data

Mar. 26, 2021 (JP) ................................ 2021-052522

(51) Int. Cl.
*H10F 39/00* (2025.01)

(52) U.S. Cl.
CPC ......... *H10F 39/804* (2025.01); *H10F 39/026* (2025.01); *H10F 39/8063* (2025.01); *H10F 39/811* (2025.01)

(58) Field of Classification Search
None
See application file for complete search history.

(56) References Cited

U.S. PATENT DOCUMENTS

2007/0190691 A1 8/2007 Humpston
2008/0042227 A1 2/2008 Asano et al.
(Continued)

FOREIGN PATENT DOCUMENTS

EP 2282327 A2 2/2011
JP 2010-147327 7/2010
(Continued)

OTHER PUBLICATIONS

International Search Report and Written Opinion prepared by the Japan Patent Office on Mar. 9, 2022, for International Application No. PCT/JP2021/048819, 3 pgs.

*Primary Examiner* — Nicholas J Tobergte
(74) *Attorney, Agent, or Firm* — SHERIDAN ROSS P.C.

(57) ABSTRACT

Miniaturization is facilitated in a semiconductor package provided with pixels. A semiconductor package includes a transparent member, a semiconductor chip, a photosensitive rib, and an interposer. In this semiconductor package, pixels are arranged on a part of a chip plane of the semiconductor chip. The photosensitive rib is a photosensitive resin disposed between a region not corresponding to the pixel in the chip plane of the semiconductor chip and the transparent member. Furthermore, the interposer is electrically connected to the semiconductor chip.

20 Claims, 29 Drawing Sheets

(56) References Cited

U.S. PATENT DOCUMENTS

| | | | | |
|---|---|---|---|---|
| 2010/0155869 | A1* | 6/2010 | Komori | H10F 39/804<br>257/E31.127 |
| 2011/0024861 | A1* | 2/2011 | Tu | H10F 77/50<br>257/434 |
| 2012/0086093 | A1* | 4/2012 | Otsuka | H04N 23/10<br>257/E31.127 |
| 2017/0195532 | A1 | 7/2017 | Kuo et al. | |
| 2020/0144318 | A1* | 5/2020 | Hsieh | H10F 39/811 |
| 2021/0005655 | A1* | 1/2021 | Kawazoe | H10F 39/8023 |

FOREIGN PATENT DOCUMENTS

| | | | |
|---|---|---|---|
| JP | 2011-035360 | | 2/2011 |
| JP | 2013-207201 | | 10/2013 |
| JP | 2013207201 | A * | 10/2013 |
| JP | 2014-045048 | | 3/2014 |
| JP | 2016-072266 | | 5/2016 |
| JP | 2017-123451 | | 7/2017 |
| JP | 2019-160847 | | 9/2019 |
| WO | WO 2006/073085 | | 7/2006 |
| WO | WO-2019171789 | A1 | 9/2019 |

* cited by examiner a b a b c d e f a b c a b a b a b

SEMICONDUCTOR PACKAGE AND METHOD FOR MANUFACTURING SEMICONDUCTOR PACKAGE

CROSS REFERENCE TO RELATED APPLICATIONS

This application is a national stage application under 35 U.S.C. 371 and claims the benefit of PCT Application No. PCT/JP2021/048819, having an international filing date of 28 Dec. 2021, which designated the United States, which PCT application claimed the benefit of Japanese Patent Application No. 2021-052522, filed 26 Mar. 2021, the entire disclosures of each of which are incorporated herein by reference.

TECHNICAL FIELD

The present technology relates to a semiconductor package. Specifically, the present technology relates to a semiconductor package having a glass on chip (GOC) structure and a method for manufacturing the semiconductor package.

BACKGROUND ART

In recent years, with the development of wafer stacking technology of devices in imaging devices, logic and pixel wiring are often arranged in a lower layer of a chip, and pixel occupancy has increased. On the other hand, application of the GOC structure for the purpose of miniaturization of the package is spreading mainly among in-vehicle packages (see, for example, Patent Document 1). Here, the GOC structure is a structure in which a semiconductor chip is die-bonded to an interposer, electrical connection is performed by wire bonding or the like, an adhesive resin is applied to the chip, a cover glass is mounted thereon, and the semiconductor chip is protected by a sealing resin or a molding resin. In a case where an imaging element is disposed as a semiconductor chip, an adhesive resin is applied to a portion other than the pixel portion.

CITATION LIST

Patent Document

Patent Document 1: Japanese Patent Application Laid-Open No. 2016-72266

SUMMARY OF THE INVENTION

Problems to be Solved by the Invention

In the above-described conventional technique, the GOC structure achieves miniaturization of the semiconductor package. However, when the adhesive resin is applied, it is necessary to secure a bonded portion having a sufficient size so that the adhesive resin does not interfere with the pixel in consideration of the application position accuracy, application stability depending on resin physical properties such as thixotropy and viscosity, resin spreading at the time of mounting the glass, and the like. Therefore, it is difficult to further reduce the size.

The present technology has been made in view of such a situation, and an object thereof is to facilitate miniaturization in a semiconductor package provided with pixels.

Solutions to Problems

The present technology has been made to solve the above-described problems, and a first aspect thereof is a semiconductor package including a transparent member, a semiconductor chip in which pixels are arranged on a part of a chip plane, a photosensitive rib that is a photosensitive resin disposed between a region not corresponding to the pixel in the chip plane and the transparent member, and an interposer electrically connected to the semiconductor chip. This brings about an effect of facilitating miniaturization.

Furthermore, in the first aspect, an adhesive resin that bonds the photosensitive rib and the semiconductor chip may be further included. This brings about an effect that the photosensitive rib is bonded in a completely cured state.

Furthermore, in the first aspect, a stopper may be further included, in which the semiconductor chip may be disposed between the transparent member and the interposer, the photosensitive rib may be formed around a predetermined region facing the pixel on a lower surface of the transparent member where a direction from the interposer to the transparent member is set as an upward direction, and the stopper may be formed between the predetermined region of the lower surface and the photosensitive rib. This brings about an effect of suppressing intrusion of bleed into the pixel.

Furthermore, in the first aspect, the photosensitive rib may be formed in close contact with both the transparent member and the semiconductor chip. This brings about an effect that the adhesive resin is unnecessary.

Furthermore, in the first aspect, the transparent member may be a lens. This brings about an effect that the cover glass is unnecessary.

Furthermore, in the first aspect, the cross-sectional shape of the photosensitive rib may be a tapered shape. This brings about an effect of suppressing incidence of reflected light on the pixel.

Furthermore, in the first aspect, the semiconductor chip may include a silicon substrate and an organic film formed on a part of a substrate surface of the silicon substrate, in which the photosensitive rib may be disposed between a region of the substrate surface where the organic film is not formed and the transparent member. This brings about an effect of avoiding a defect due to peeling of the organic film.

Furthermore, in the first aspect, the semiconductor chip may have an opening, and a distance from an end of the opening to the organic film may not be less than 200 micrometers. This brings about an effect of avoiding a defect due to peeling of the organic film.

Furthermore, in the first aspect, a shape of an inner wall of the photosensitive rib may be a shape obtained by connecting a plurality of triangular prisms with a direction toward the pixel as an inner direction. This brings about an effect of improving optical characteristics.

Furthermore, in the first aspect, a shape of an outer wall of the photosensitive rib with respect to an inner wall may be a shape in which a plurality of triangular prisms is connected. This brings about an effect of improving optical characteristics.

Furthermore, in the first aspect, a dam, and a sealing resin that seals the semiconductor chip, the transparent member, and the interposer may be further included, in which the semiconductor chip may be disposed between the transparent member and the interposer, and the dam may be formed around a light receiving region immediately above the pixel on an upper surface of the transparent member where a direction from the interposer to the transparent member is set as an upward direction. This brings about an effect of preventing protrusion of the resin.

Furthermore, in the first aspect, a part of the sealing resin may shield a region between an outer periphery of the transparent member and the dam in the upper surface of the transparent member. This brings about an effect of preventing protrusion of the sealing resin.

Furthermore, in the first aspect, a molding resin that shields a region between an outer periphery of the transparent member and the dam in the upper surface of the transparent member may be further included. This brings about an effect of preventing protrusion of the molding resin.

Furthermore, a second aspect of the present technology is a method for manufacturing a semiconductor package including a connection procedure of electrically connecting a semiconductor chip in which pixels are arranged on a part of a predetermined chip plane and an interposer, a photosensitive rib forming procedure of forming a photosensitive resin as a photosensitive rib in a region of one of both surfaces of a transparent member, the region not facing the pixel, and a placement procedure of placing the transparent member on which the photosensitive rib is formed on the semiconductor chip. This brings about an effect of facilitating miniaturization.

Furthermore, in the second aspect, an application procedure of applying a resist to the semiconductor chip including a silicon substrate and an organic film formed on a substrate surface of the silicon substrate, a resist removal procedure of removing a part of the resist, and an organic film removal procedure of removing a portion of the organic film to which the resist is not applied may be further included, in which the connection procedure may be executed after the organic film removal procedure. This brings about an effect of avoiding a defect due to peeling of the organic film.

MODE FOR CARRYING OUT THE INVENTION

A mode for carrying out the present technology (hereinafter, referred to as an embodiment) is hereinafter described. The description will be made in the following order.

1. First embodiment (example in which photosensitive rib is formed on lower surface of transparent member)
2. Second embodiment (example in which photosensitive rib is formed on lower surface of transparent member, and organic film under photosensitive rib is removed)

3. Third embodiment (example in which photosensitive rib is formed on lower surface of transparent member and inner walls thereof are jagged)
4. Fourth embodiment (example in which photosensitive rib is formed on lower surface of transparent member, and dam is formed on upper surface of photosensitive rib)

1. First Embodiment

[Configuration Example of Semiconductor Package]

Figure 1:
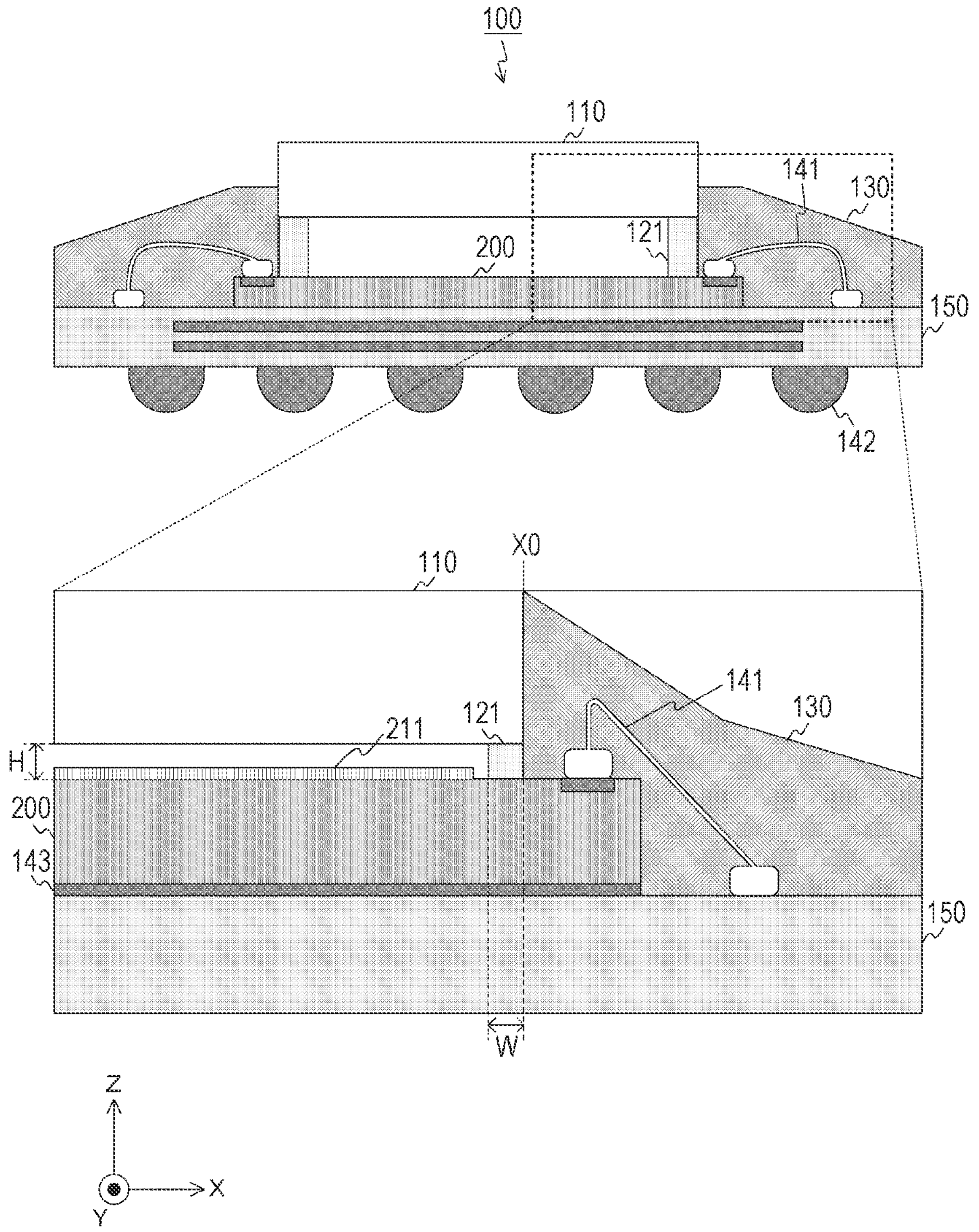
FIG. 1 is an example of a cross-sectional view of a semiconductor package according to a first embodiment of the present technology.

FIG. 1 is an example of a cross-sectional view of a semiconductor package 100 according to a first embodiment of the present technology. The semiconductor package 100 is a semiconductor package mounted on an imaging device or the like, and includes a transparent member 110, a semiconductor chip 200, and an interposer 150.

The semiconductor chip 200 captures image data. A plurality of pixels 211 is arranged on a part of a chip plane of the semiconductor chip 200. As the semiconductor chip 200, for example, a solid-state imaging element is used.

Hereinafter, an axis perpendicular to the chip plane of the semiconductor chip 200 is referred to as a "Z axis", and a predetermined axis parallel to the chip plane is referred to as an "X axis". An axis perpendicular to the X axis and the Z axis is referred to as a "Y axis". The drawing is a cross-sectional view when viewed from a Y-axis direction. Furthermore, the semiconductor chip 200 is disposed between the interposer 150 and the transparent member 110, and a direction from the interposer 150 to the transparent member 110 is set as an upward direction.

Furthermore, although some of regions are provided with patterns in the drawing, these patterns are merely provided to facilitate identification of the ranges of regions, and are irrelevant to the actual appearance and material. Furthermore, portions having the same pattern are not necessarily made by the same material. The same applies to the following drawings.

The interposer 150 is a substrate that relays a signal between the semiconductor chip 200 and a circuit outside the semiconductor package 100. As a material of the interposer 150, ceramic, an organic material, flexible printed circuits (FPC), glass, silicon, or the like is used. Furthermore, a part of an upper surface of the interposer 150 is bonded to a lower surface of the semiconductor chip 200 by a die attach material 143.

As the die attach material 143, an epoxy-based, acrylic-based, or silicone-based paste material, or a die attach film (DAF) is used.

Furthermore, a bonding pad (not illustrated) is provided in a region of the upper surface of the interposer 150 that is not bonded to the semiconductor chip 200, and is electrically connected (that is, wire bonding) to the semiconductor chip 200 by the wire 141. Note that, instead of wire bonding, the interposer 150 and the semiconductor chip 200 can be electrically connected by side wiring or flip-chip mounting.

Furthermore, a plurality of solder balls 142 is arranged on a lower surface of the interposer 150. With these solder balls 142, the semiconductor package 100 is mounted on an external substrate or the like. The semiconductor package thus mounted is also called a ball grid array (BGA) package.

Note that, instead of the BGA package, a surface mount package other than the BGA, such as a land grid array (LGA) or a leaded chip carrier (LCC), can be used as the semiconductor package 100. Alternatively, instead of the surface mounting type, a lead-insertion type package such as a dual in-line package (DIP), a single in-line package (SIP), or a pin grid array (PGA) can be used as the semiconductor package 100.

The transparent member 110 is, for example, a cover glass, and is placed so that its lower surface faces an upper surface of the semiconductor chip 200. As the transparent member 110, a borosilicate glass, a crystal plate, or a resin transparent plate is used. Note that, instead of the cover glass, a lens can be placed as the transparent member 110.

Furthermore, a photosensitive resin is formed by lithography in a region of the lower surface of the transparent member 110 that does not face the pixel 211. This photosensitive resin is hereinafter referred to as a "photosensitive rib 121". Note that an anti-reflection (AR) coating, an infra-red (IR) cut coating, a visible light cut coating or the like can be further formed on an upper surface of the transparent member 110.

As a material of the photosensitive rib 121 (that is, the photosensitive resin), a photosensitive material that generates a component that cures a monomer when irradiated with ultraviolet rays or a material that cures when irradiated with ultraviolet rays to develop negativity is used. As the latter, an epoxy silicone material or an epoxy acrylic material is used. In addition, a material having a small amount of outgas after photolithographic patterning is preferable. For example, the amount of outgas in the process of heating at 200° ° C. for 10 minutes at the time of assembly is preferably 5000 to 20,000 ppm. In addition, a material having a good patterning property and adhesion is preferable.

Furthermore, the photosensitive rib 121 is formed in a region within a certain range from an end (such as a right end X0 in the drawing) of the transparent member 110 in the X-axis direction and the Y-axis direction. Note that, in the drawing, a right end of the photosensitive rib 121 is matched with the right end of the transparent member 110, but the right end of the photosensitive rib 121 can be separated from the right end of the transparent member 110.

Furthermore, the cross-sectional shape of the photosensitive rib 121 is rectangular. The size of the photosensitive rib 121 in a direction (X-axis direction or Y-axis direction) parallel to the chip plane of the semiconductor chip 200 is defined as "width", and the size of the photosensitive rib 121 in a Z-axis direction is defined as "height". The width W of the photosensitive rib 121 is, for example, 0.05 millimeters (mm) or more, and the height H is 0.01 to 0.03 millimeters (mm).

Furthermore, the photosensitive rib 121 (photosensitive resin) is not completely reacted at the molding stage, leaving an uncured portion, and is brought into close contact with the semiconductor chip 200 by thermal application when the transparent member 110 is placed. At this time, it is desirable to set the elastic modulus of the uncured portion to 100 megapascal (MPa) or less in order to cause the photosensitive resin to follow irregularities of the semiconductor chip 200 to cause sufficient adhesion.

The sealing resin 130 seals and protects the transparent member 110, the semiconductor chip 200, and the interposer 150. As the sealing resin 130, an epoxy resin, an acrylic resin, or a silicone resin is used.

Note that, after the sealing resin 130 is formed, a molding resin can be further formed for protection. In addition, the transparent member 110, the semiconductor chip 200, and the interposer 150 can be disposed in the semiconductor package 100 in which a cavity is formed in advance by a partition wall and the interposer 150 without providing the molding resin.

As described above, the structure in which the semiconductor chip 200 is electrically connected to the interposer 150, the transparent member 110 (cover glass) is mounted thereon, and the semiconductor chip is protected by the sealing resin 130 or the molding resin corresponds to the GOC structure.

Furthermore, the photosensitive rib 121 (that is, the photosensitive resin) is disposed between a region not corresponding to the pixel 211 in the chip plane of the semiconductor chip 200 and the transparent member 110. Since the photosensitive resin can be molded with high accuracy by exposure or development as compared with the case of applying an adhesive resin in paste form, design shrinkage of the bonded portion becomes possible. Furthermore, by setting an exposure condition so that the resin is not deformed (in other words, the resin does not spread) at the time of thermocompression bonding to the semiconductor chip 200, it is not necessary to consider the amount of protrusion of the resin at the time of design.

Figure 2:
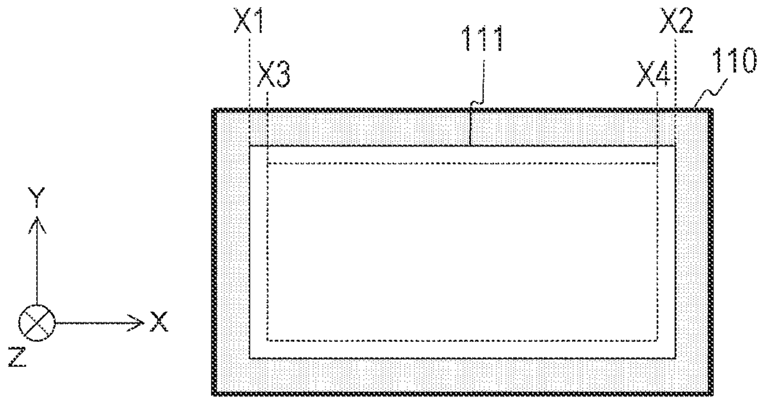
FIG. 2 is an example of a plan view of a transparent member and a semiconductor chip according to the first embodiment of the present technology.
Figure 2:
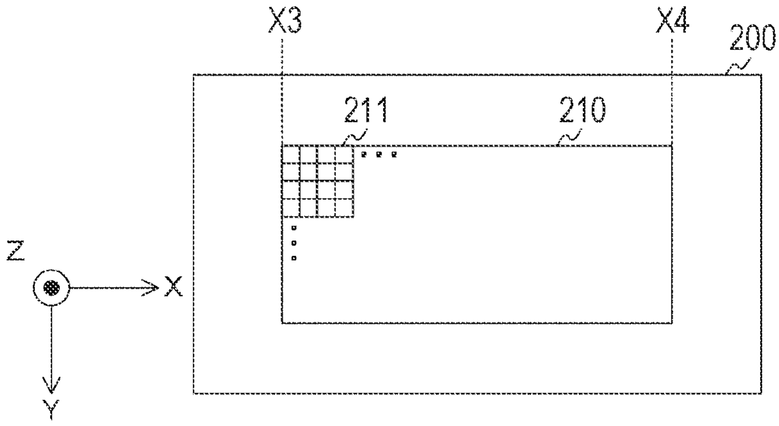

FIG. 2 is an example of a plan view of the transparent member 110 and the semiconductor chip 200 according to the first embodiment of the present technology. In the drawing, a is a bottom view of the transparent member 110 before placement. In the drawing, b is a top view of the semiconductor chip 200.

A thick line in a of the drawing indicates an outer periphery of the transparent member 110. The gray portion indicates a portion where the photosensitive rib 121 is formed. As illustrated in a of the drawing, the photosensitive rib 121 is formed around a rectangular opening region 111.

As illustrated in b of the drawing, a rectangular imaging unit 210 is formed on the chip plane (that is, the upper surface) of the semiconductor chip 200. In the imaging unit 210, a plurality of pixels 211 is arranged in a two-dimensional lattice pattern. Each of the pixels 211 photoelectrically converts incident light to generate a pixel signal. Then, the pixel signals are processed by a signal processing circuit (not illustrated) in the subsequent stage, and image data is generated.

The opening region 111 includes a region facing the imaging unit 210 when the transparent member 110 is placed. A region surrounded by a dotted line in the opening region 111 indicates the region facing the imaging unit 210. A predetermined margin is preferably provided between the region facing the imaging unit 210 and the photosensitive rib 121. For example, a right end X3 and a left end X4 of the imaging unit 210 are located between a left end X1 and a right end X2 of the opening region 111 in the X-axis direction. The same applies to the Y-axis direction.

As illustrated in the drawing, the photosensitive rib 121 is formed on the lower surface of the transparent member 110 except for a region facing the pixel 211 (that is, the region surrounded by the dotted line in the drawing).

Figure 3:
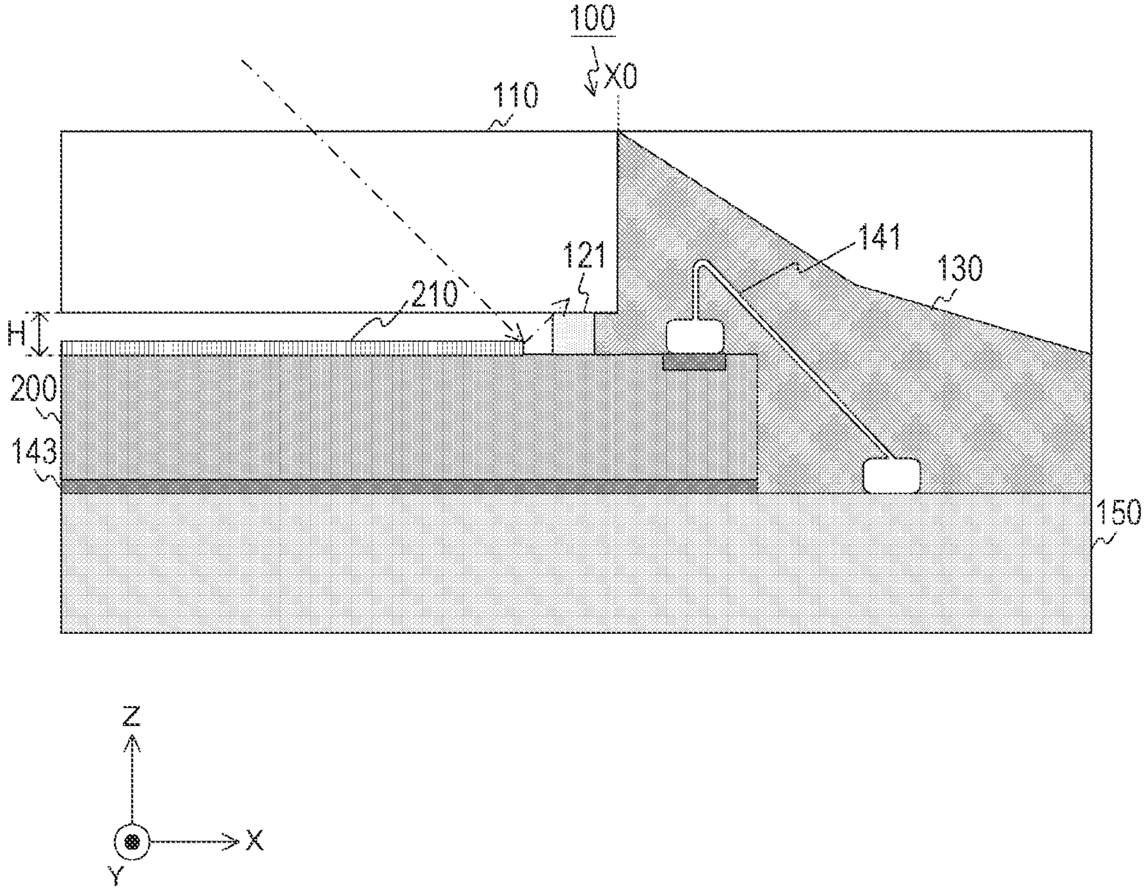
FIG. 3 is a view for describing an effect of suppressing flare and the like according to the first embodiment of the present technology.

FIG. 3 is a view for describing an effect of suppressing flare in the first embodiment of the present technology. Preferably, the transmittance of the photosensitive rib 121 (photosensitive resin) is set to 98% (%) or more, and the reflectance is set to 0.01 to 1% (%). Thus, reflected light incident on the upper surface of the semiconductor chip 200 can be transmitted into the photosensitive rib 121, and re-incidence of unnecessary light can be suppressed. Consequently, occurrence of flare and ghost is suppressed.

Note that, as illustrated in the drawing, the right end of the photosensitive rib 121 can be separated from the right end of the transparent member 110. The same applies to the left end. Here, a configuration in which the transparent member 110 is bonded to the semiconductor chip 200 with an adhesive resin in paste form instead of the photosensitive rib 121 is assumed as a first comparative example.

Figure 4:
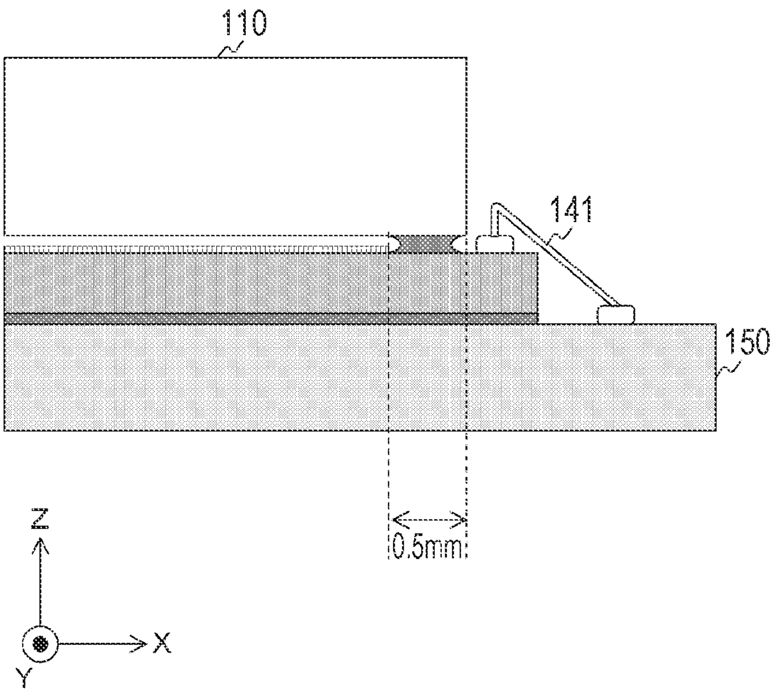
FIG. 4 is an example of a cross-sectional view of a semiconductor package in a first comparative example.

FIG. 4 is an example of a cross-sectional view of a semiconductor package in the first comparative example. In the first comparative example, the semiconductor chip 200 is die-bonded to the interposer 150 and electrically connected thereto, and then the adhesive resin is applied using a dispenser or the like in addition to the pixel portion, and the transparent member 110 is mounted thereon. At this time, it is necessary to perform device design in consideration of application positional accuracy of the adhesive resin applied onto the semiconductor chip 200, application stability depending on resin physical properties such as thixotropy and viscosity, resin spreading at the time of mounting the glass, and the like. In particular, it is necessary to perform device design for securing a sufficient size in which the adhesive resin does not interfere with the pixel portion. This is a factor that reduces the merit of the wafer stacking technology that can shrink the device. For example, the width of the adhesive resin needs to be 0.5 millimeters (mm) or more.

Furthermore, in a case where the transmittance of the adhesive resin is low and the reflectance is high, when the distance between the adhesive resin and the pixel becomes short, light incident on the semiconductor chip 200 may be reflected by the adhesive resin, and flare or ghost may occur.

On the other hand, in the semiconductor package 100 of FIG. 1, the photosensitive rib 121 (photosensitive resin) is disposed between the region not corresponding to the pixel 211 in the chip plane and the transparent member 110. Since the photosensitive resin can be molded with high accuracy by exposure or development, the bonded portion can be shrunk. For example, the width W of the photosensitive rib 121 can be set to about 0.05 millimeters (mm).

Furthermore, by disposing the photosensitive rib 121 having high transmittance and low reflectance, flare and ghost can be suppressed.

[Method for Manufacturing Semiconductor Package]

Figure 5:
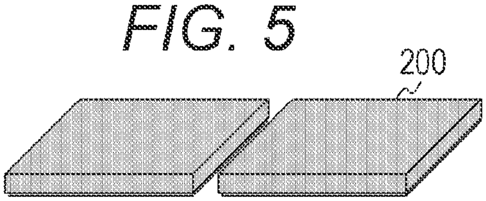
FIG. 5 is a view for describing a method for manufacturing the semiconductor package according to the first embodiment of the present technology.
Figure 5:
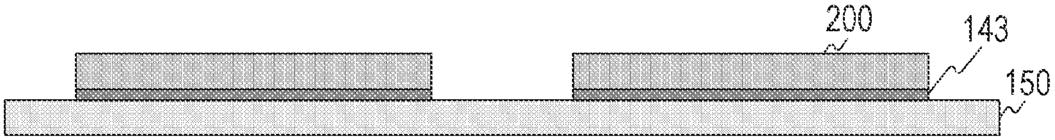
Figure 5:
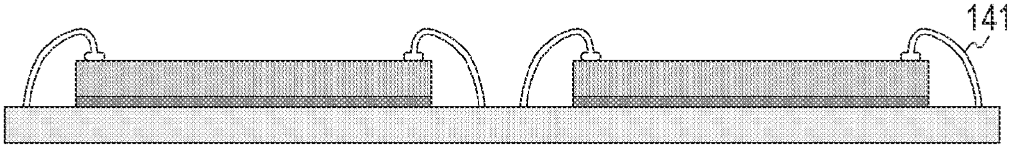
Figure 5:
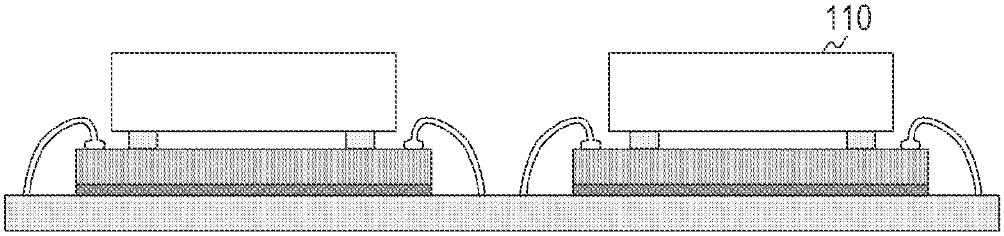
Figure 5:
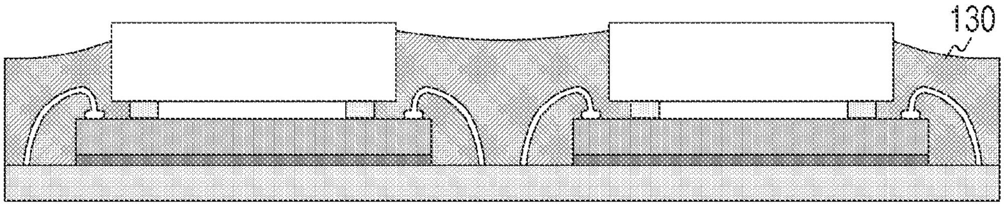
Figure 5:
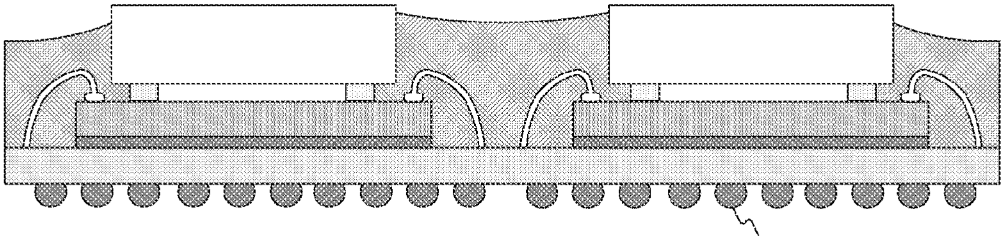

FIG. 5 is a view for describing the method for manufacturing the semiconductor package 100 according to the first embodiment of the present technology. The manufacturing system manufactures a plurality of semiconductor chips 200 as illustrated in a of the drawing. As illustrated in b of the drawing, the manufacturing system die-bonds each of the semiconductor chips 200 to the interposer 150 by the die attach material 143.

Then, as illustrated in c of the drawing, the manufacturing system electrically connects each of the semiconductor chips 200 and the interposer 150 by the wire 141. As illustrated in d of the drawing, the manufacturing system places the transparent member 110 having the photosensitive rib 121 formed on the lower surface on the upper surface of the semiconductor chip 200.

Then, the manufacturing system performs sealing with the sealing resin 130 as illustrated in e of the drawing. The manufacturing system attaches each of the solder balls 142 to the lower surface of the interposer 150 as illustrated in f of the drawing. The structure is separated into a plurality of parts, and a plurality of semiconductor packages 100 is manufactured.

Figure 6:
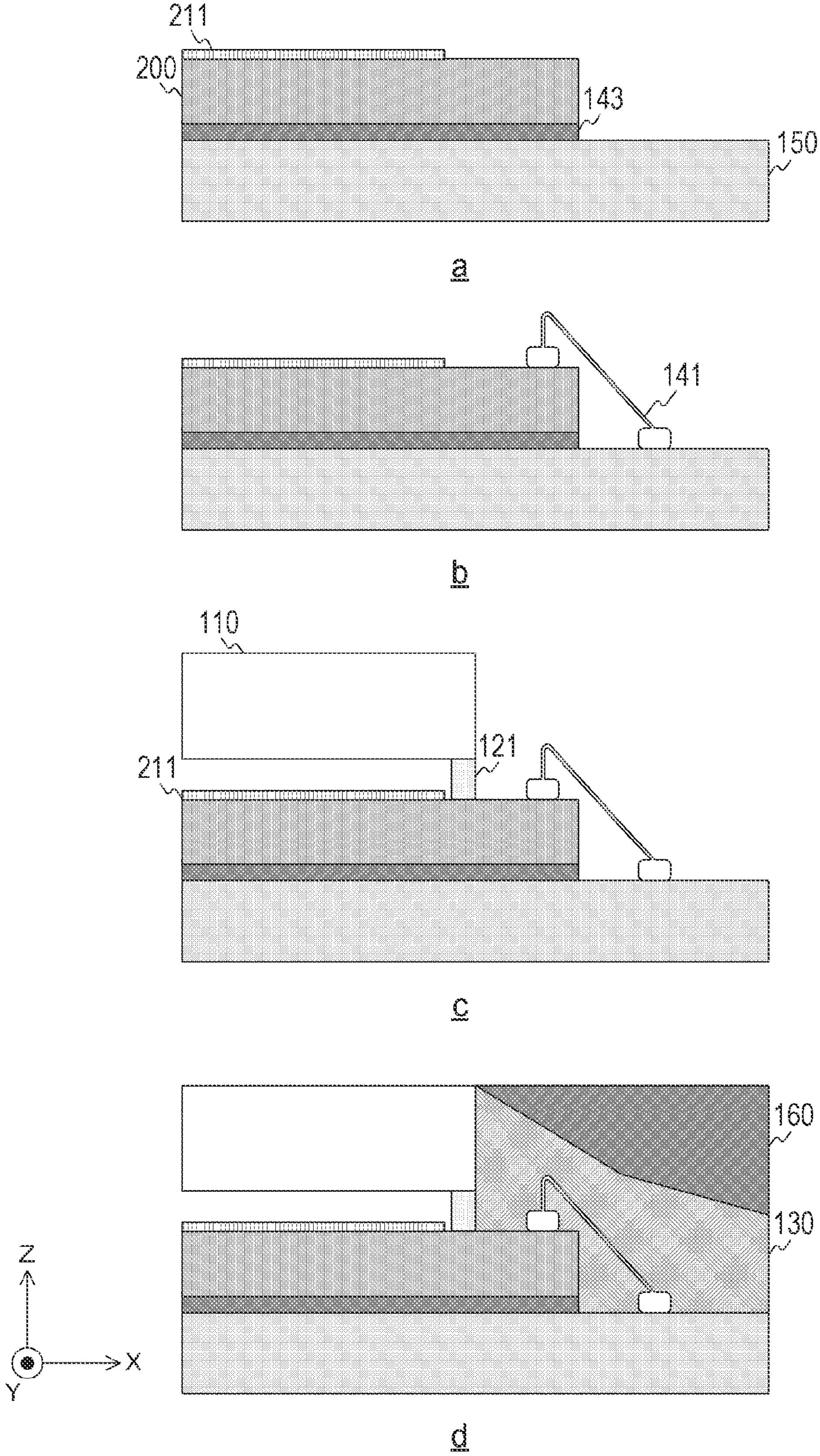
FIG. 6 is a view for describing steps from die bonding to sealing according to the first embodiment of the present technology.

FIG. 6 is a view for describing steps from die bonding to sealing according to the first embodiment of the present technology. In the drawing, a to d are enlarged views of b, c, d, and e in FIG. 5.

The manufacturing system performs die bonding as illustrated in a of FIG. 6 and performs electrical connection as illustrated in b of the drawing. Then, as illustrated in c of the drawing, the manufacturing system thermocompression-bonds the transparent member 110 with the photosensitive rib 121 (photosensitive resin) to a region other than the pixel 211 on the chip surface. The photosensitive resin is not completely cured at the time of exposure, and a shape is formed in a semi-cured state, and an adhesion function remains. By setting the elastic modulus (equal to or less than 100 MPa or the like) to follow irregularities of the device at the time of thermocompression bonding, it is possible to suppress an unbonded portion.

Then, the manufacturing system forms the sealing resin 130 as illustrated in d of the drawing. Furthermore, a molding resin 160 can also be formed.

Figure 7:
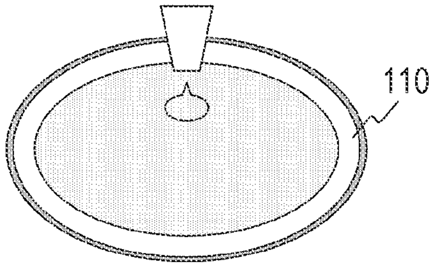
FIG. 7 is a view for describing a method for manufacturing the transparent member according to the first embodiment of the present technology.
Figure 7:
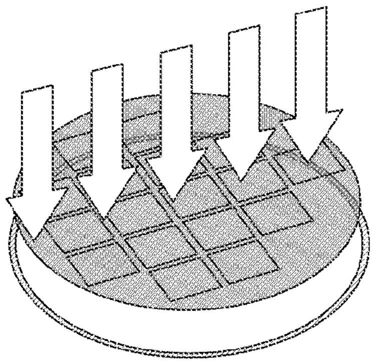
Figure 7:
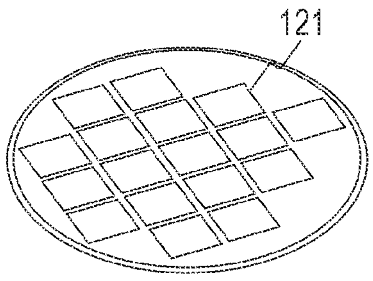

FIG. 7 is a view for describing a method for manufacturing the transparent member 110 according to the first embodiment of the present technology. The step in the drawing is performed before c in FIG. 6. The respective steps in FIGS. 6 and 7 can be executed in parallel or can be executed in order.

As illustrated in a of FIG. 7, the manufacturing system applies the photosensitive resin to a glass wafer. A gray portion in a of the drawing indicates the photosensitive resin. As illustrated in b of the drawing, the manufacturing system exposes and develops the photosensitive resin while masking the portion facing the pixel 211. The manufacturing system divides the glass wafer for each chip as illustrated in c of the drawing. Through these steps, the transparent member 110 with the photosensitive rib 121 is formed.

As illustrated in the drawing, by forming the photosensitive resin film on the transparent member 110 (glass) side, development can be performed without considering damage to the semiconductor chip 200 side. Therefore, the residue of the resin can be reduced, leading to improvement of the yield. Moreover, since the photosensitive resin is exposed from the resin side without passing through the transparent member 110, wavelength attenuation due to the type of cover glass or coat does not need to be considered.

Furthermore, by setting an exposure condition so that the resin is not deformed (in other words, the resin does not spread) at the time of thermocompression bonding to the semiconductor chip 200, it is not necessary to consider the amount of protrusion of the resin at the time of design.

Figure 8:
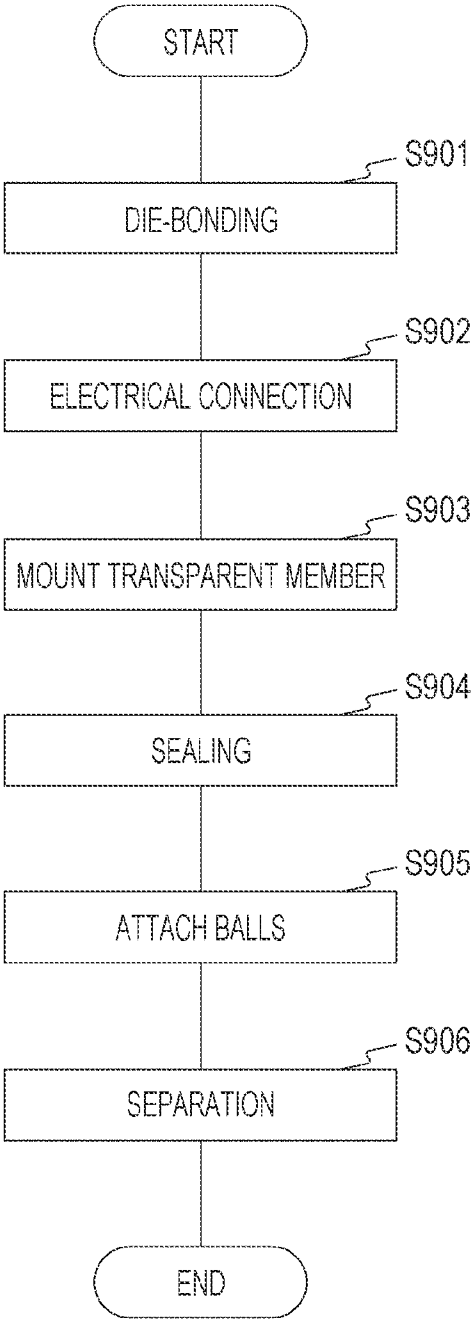
FIG. 8 is an example of a flowchart illustrating the method for manufacturing the semiconductor package according to the first embodiment of the present technology.

FIG. 8 is an example of a flowchart illustrating the method for manufacturing the semiconductor package according to the first embodiment of the present technology.

The manufacturing system die-bonds each of the semiconductor chips 200 to the interposer 150 (step S901), and electrically connects each of the semiconductor chips 200 and the interposer 150 (step S902). Then, the manufacturing system mounts the transparent member 110 on which the photosensitive rib 121 is formed on the upper surface of the semiconductor chip 200 (step S903), and seals the upper surface with the sealing resin 130 (step S904). The manufacturing system attaches the solder balls 142 (step S905) and separates the structure into a plurality of pieces (step S906). After step S906, the manufacturing system ends the manufacturing process of the semiconductor package 100.

Figure 9:
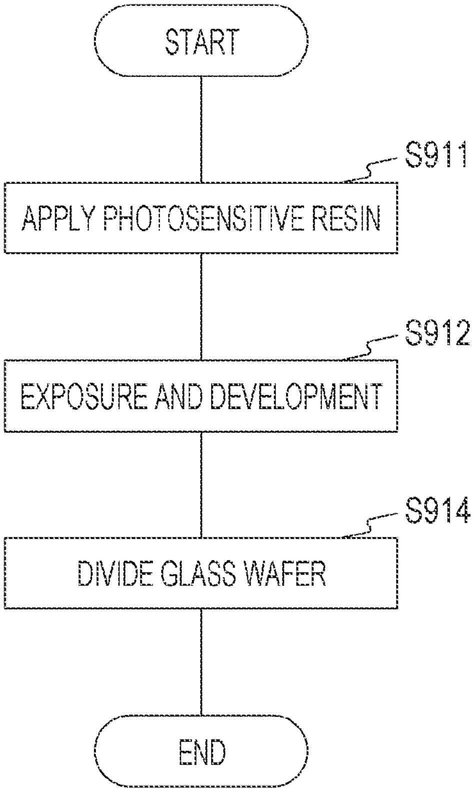
FIG. 9 is an example of a flowchart illustrating the method for manufacturing the transparent member according to the first embodiment of the present technology.

FIG. 9 is an example of a flowchart illustrating the method for manufacturing the transparent member 110 according to the first embodiment of the present technology.

The manufacturing system applies the photosensitive resin to the glass wafer (step S911). The manufacturing system exposes and develops the photosensitive resin while masking the portion facing the pixel 211 (step S912). The manufacturing system divides the glass wafer for each chip (step S914). After step S914, the manufacturing system ends the manufacturing process of the transparent member 110 and starts a subsequent process.

As described above, according to the first embodiment of the present technology, since the photosensitive rib 121 (photosensitive resin) is disposed between the region of the semiconductor chip 200 not corresponding to the pixel and the transparent member 110, it is possible to shrink the bonded portion as compared with the case of using the adhesive resin. This facilitates miniaturization of the semiconductor package 100.

[First Modification]

In the first embodiment described above, the cross-sectional shape of the photosensitive rib 121 is formed to be rectangular, but the cross-sectional shape of the photosensitive rib 121 is not limited to rectangular. The semiconductor package 100 according to a first modification of the first embodiment is different from that of the first embodiment in that a cross-sectional shape of the photosensitive rib 121 is a tapered shape.

Figure 10:
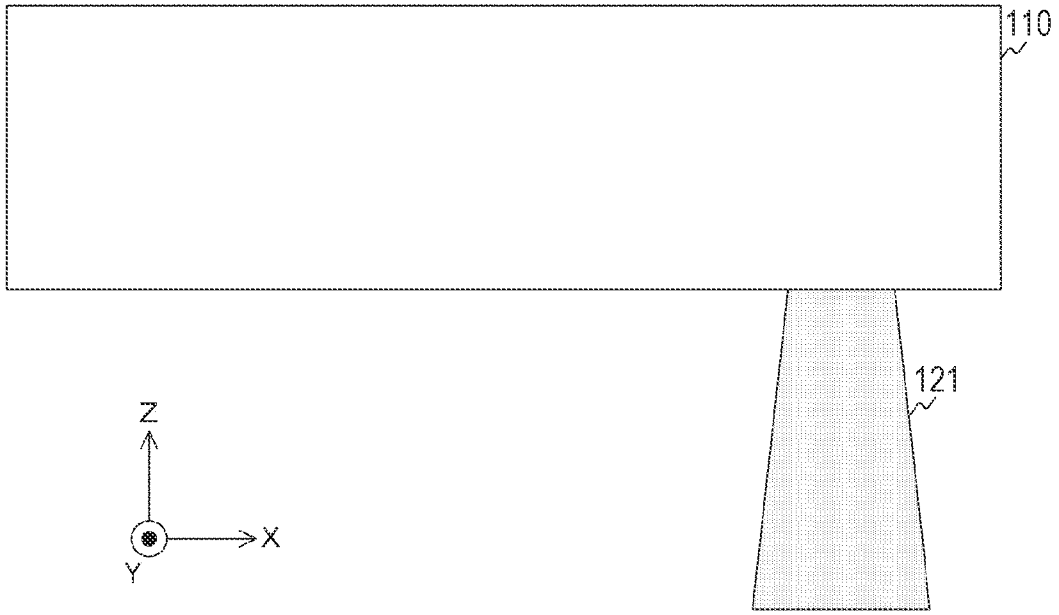
FIG. 10 is a view illustrating an example of a cross-sectional shape of a photosensitive rib according to a first modification of the first embodiment of the present technology.
Figure 10:
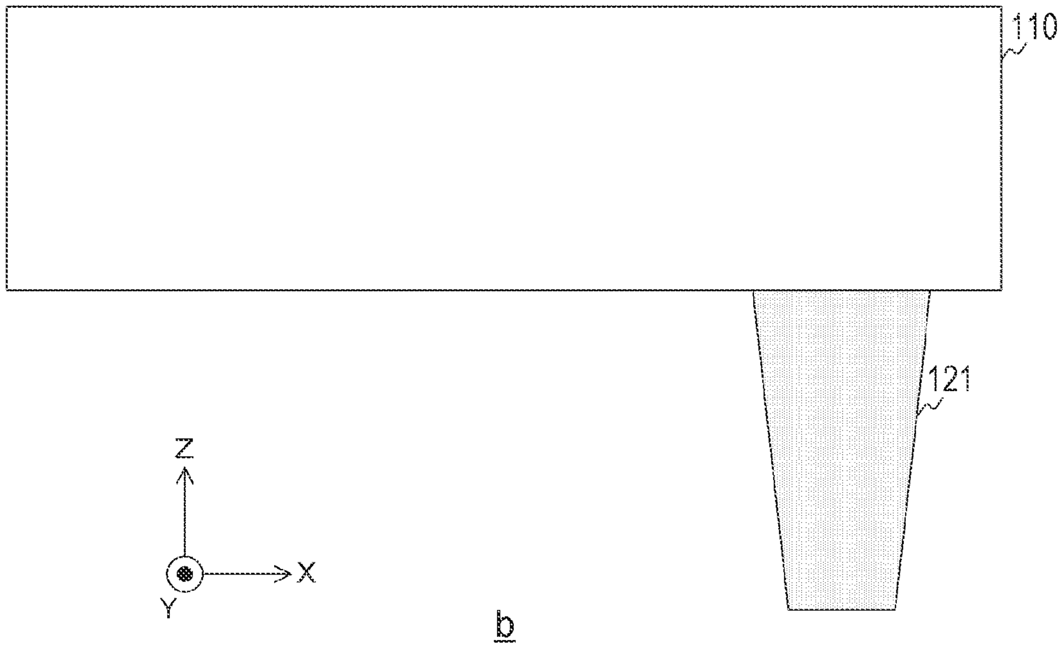

FIG. 10 is a view illustrating an example of a cross-sectional shape of the photosensitive rib 121 according to the first modification of the first embodiment of the present technology. As illustrated in a of the drawing, in the first modification of the first embodiment, the area of an upper surface of the photosensitive rib 121 is smaller than the area of the lower surface. Thus, the photosensitive rib 121 becomes thinner in an upward direction (in other words, tapered).

Note that, as illustrated in b of the drawing, the area of the upper surface of the photosensitive rib 121 can be made larger than the area of the lower surface to be tapered downward.

The manner of occurrence of flare and ghost varies depending on the angle (optical path) of incident light. In the photosensitive resin, it is possible to control the shape by adjusting the focus at the time of exposure, and it is possible to select the shape according to the application as illustrated in the drawing.

Furthermore, although the transmittance and the reflectance effective for suppressing flare and ghost differ depending on the module to be mounted, the photosensitive resin itself can be colored, so that the transmittance and the reflectance can be controlled to desired values.

Furthermore, by forming the tapered shape, the reflected light reflected by the photosensitive rib 121 can be reduced, and the incidence of the reflected light on the pixel can be suppressed.

As described above, according to the first modification of the first embodiment of the present technology, the incident of the reflected light on the pixel can be suppressed by taper assignment of the photosensitive rib 121.

[Second Modification]

In the first embodiment described above, the photosensitive rib 121 is formed around the rectangular opening region 111, but the photosensitive rib 121 can be formed in a region other than the periphery of the rectangle. The semiconductor package 100 according to a second modification of the first embodiment is different from that of the first embodiment in that a shape of a region where the photosensitive rib 121 is formed in the transparent member 110 is different.

Figure 11:
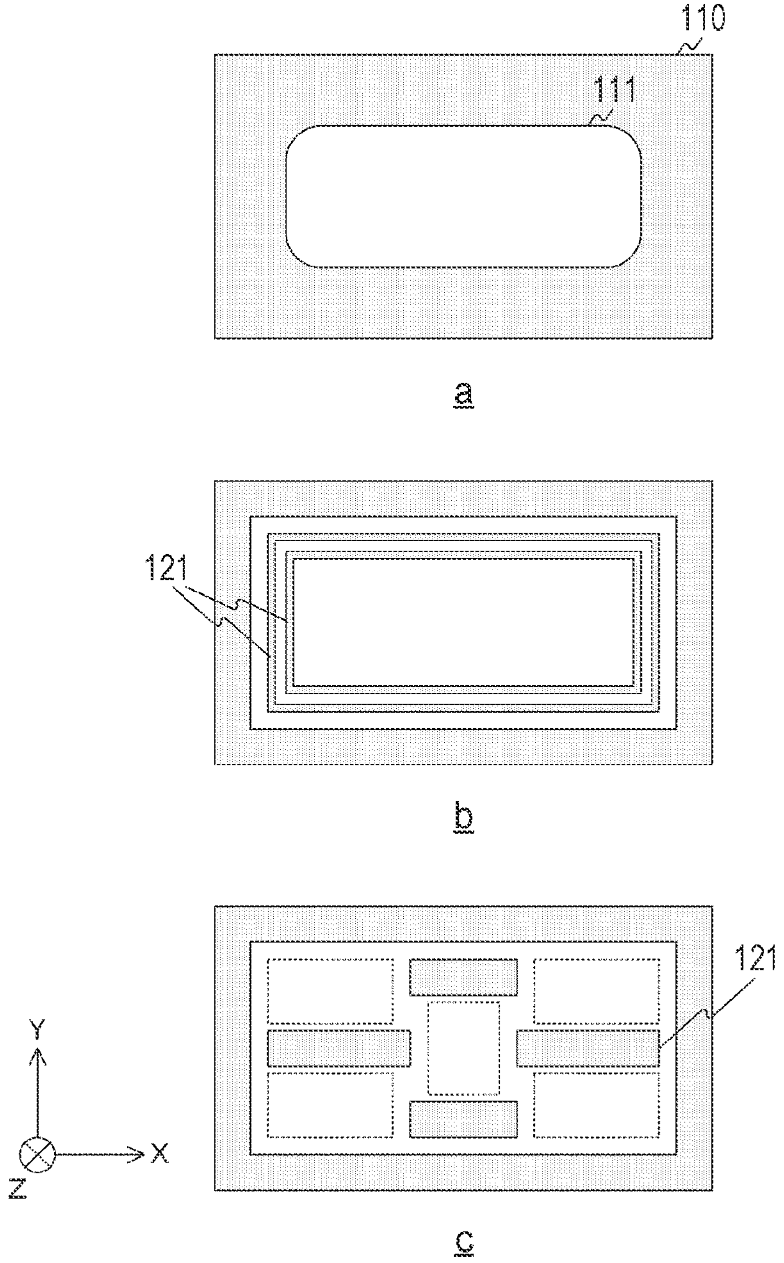
FIG. 11 is an example of a plan view of a transparent member according to a second modification of the first embodiment of the present technology.

FIG. 11 is an example of a plan view of the transparent member 110 according to the second modification of the first embodiment of the present technology. A gray portion in the drawing indicates the region where the photosensitive rib 121 is formed.

As illustrated in a of the drawing, in the second modification of the first embodiment, four corners of the opening region 111 are rounded to form a rounded square. The photosensitive rib 121 is formed around the rounded square. By rounding the four corners, stress applied to the bonded portion can be alleviated.

In recent years, a package structure is often required to have high heat resistance in order to cope with reflow mounting. By using the photosensitive resin, it is possible to stably manufacture dimensions and shapes (rounded squares, or the like) that alleviate stress applied to the bonded portion. Furthermore, since it is formed by exposure, it is possible to cope with a complicated resin shape that cannot be achieved by a paste material.

For example, as illustrated in b of the drawing, the photosensitive rib 121 can be formed in a plurality of concentric rectangular regions.

Alternatively, as illustrated in c of the drawing, in a case where a plurality of rectangular imaging units 210 is arranged on one semiconductor chip 200, it is also possible to form the photosensitive rib 121 in an island shape avoiding them. A region surrounded by a dotted line in c of the drawing indicates the region facing the imaging unit 210.

As illustrated in the drawing, the photosensitive rib 121 can be designed to have various shapes such as a periphery of a rounded square, a concentric polygon, and an island shape depending on the application.

As described above, according to the second modification of the first embodiment of the present technology, since the photosensitive rib 121 is formed around the rounded rectangle, stress applied to the bonded portion can be alleviated.

[Third Modification]

In the first embodiment described above, the photosensitive rib 121 is bonded to the semiconductor chip 200 by thermocompression bonding, but the photosensitive rib 121 and the semiconductor chip 200 can be bonded with another adhesive resin. The semiconductor package 100 according to a third modification of the first embodiment is different from that of the first embodiment in that the photosensitive rib 121 and the semiconductor chip 200 are bonded with an adhesive resin.

Figure 12:
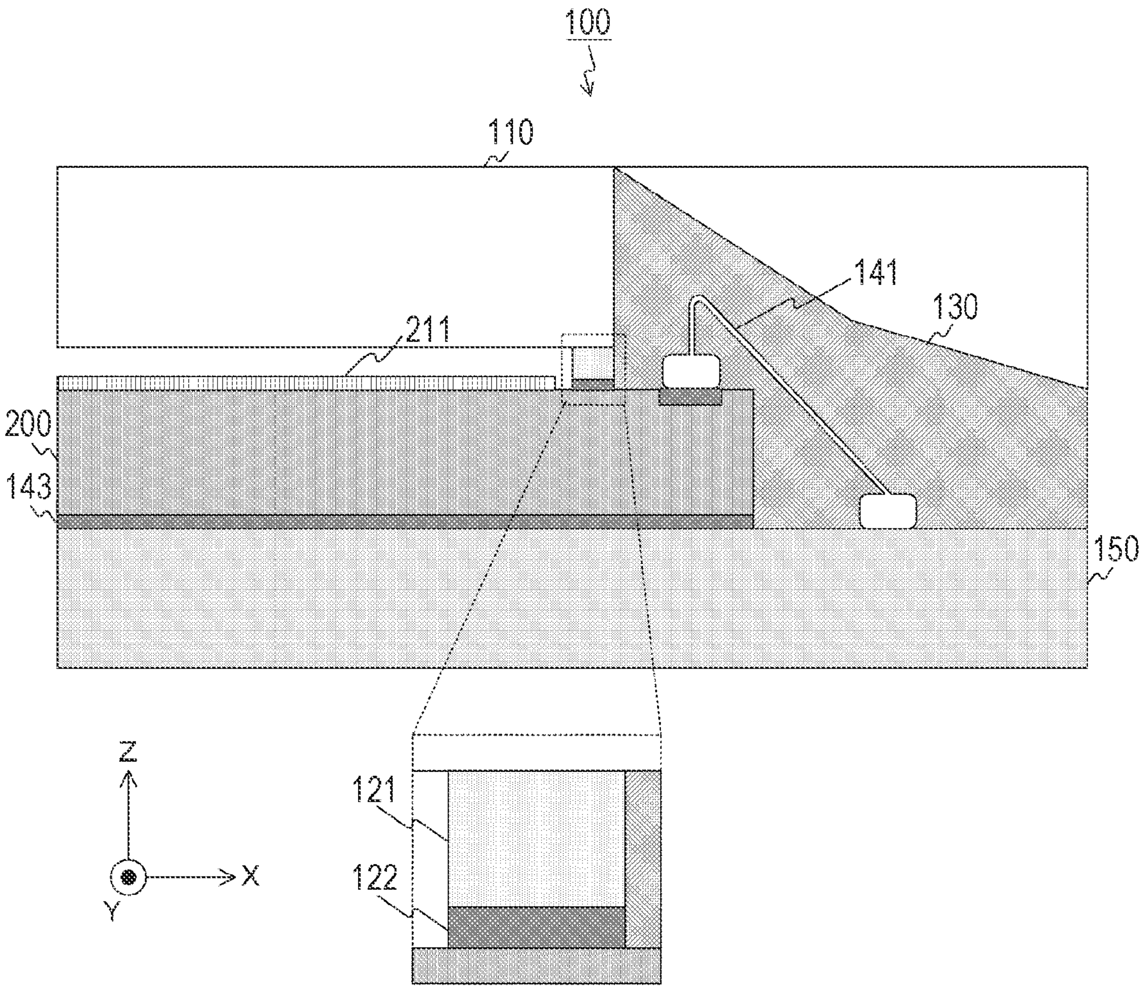
FIG. 12 is an example of a cross-sectional view of a semiconductor package according to a third modification of the first embodiment of the present technology.

FIG. 12 is an example of a cross-sectional view of the semiconductor package 100 according to the third modification of the first embodiment of the present technology. The semiconductor package 100 according to the third modification of the first embodiment is different from that of the first embodiment in that a lower surface of the photosensitive rib 121 and an upper surface of the semiconductor chip 200 are bonded by an adhesive resin 122.

Figure 13:
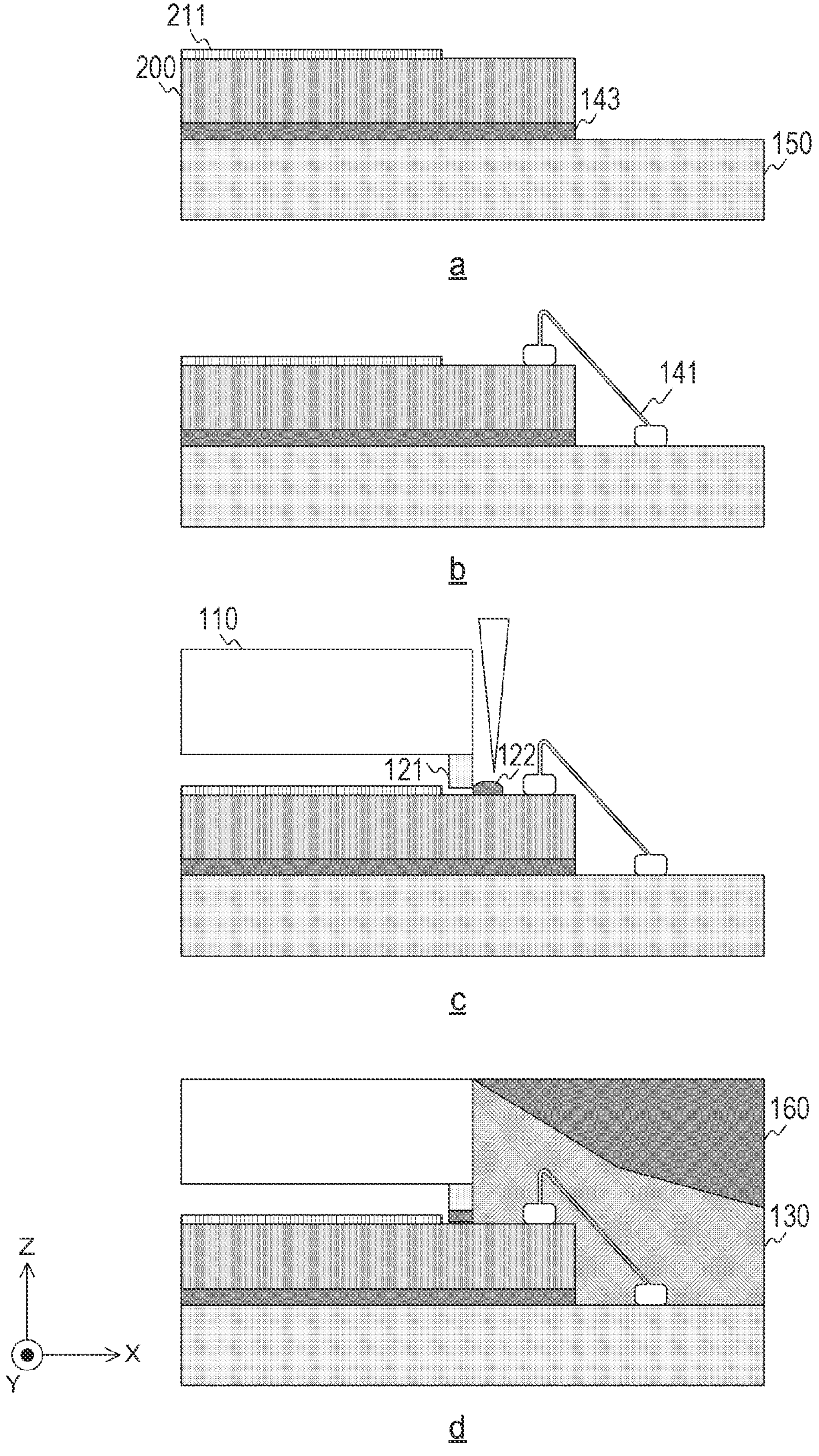
FIG. 13 is a view for describing steps from die bonding to sealing according to the third modification of the first embodiment of the present technology.

FIG. 13 is a view for describing steps from die bonding to sealing according to the third modification of the first embodiment of the present technology.

The manufacturing system performs die bonding as illustrated in a of the drawing, and performs electrical connection as illustrated in b of the drawing. Then, as illustrated in c of the drawing, the manufacturing system places the transparent member 110 on which the photosensitive rib 121 is completely cured in advance. Then, the manufacturing system applies the adhesive resin 122 having low viscosity from the outside of the transparent member 110, and performs permeation adhesion using the capillary phenomenon. Thus, as illustrated in d of the drawing, the adhesive resin 122 is filled between the lower surface of the photosensitive rib 121 and the upper surface of the semiconductor chip 200.

Figure 14:
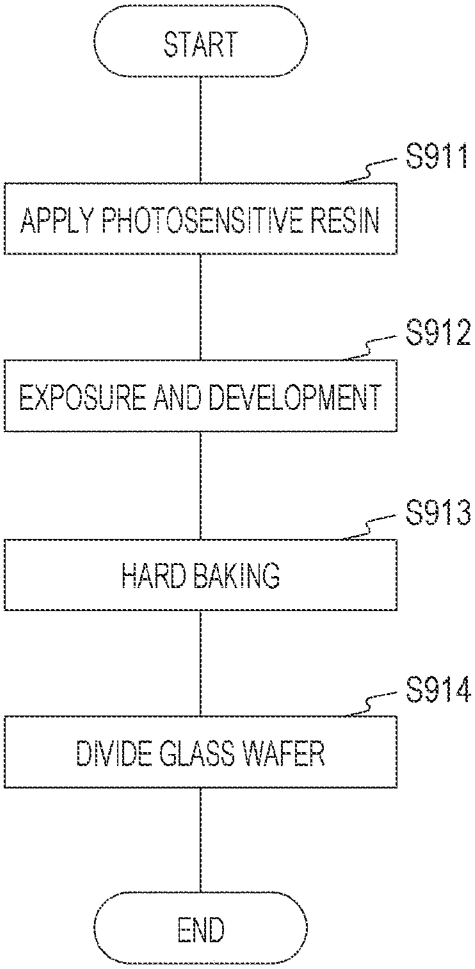
FIG. 14 is an example of a flowchart illustrating a method for manufacturing a transparent member according to the third modification of the first embodiment of the present technology.

FIG. 14 is an example of a flowchart illustrating a method for manufacturing a transparent member according to the third modification of the first embodiment of the present technology.

The manufacturing system applies the photosensitive resin to a glass wafer (step S911), and performs exposure and development (step S912). Then, the manufacturing system performs hard baking to completely cure the photosensitive resin (step S913). After curing, the photosensitive resin can be used as a spacer. Then, the manufacturing system divides the glass wafer for each chip (step S914).

As described above, according to the third modification of the first embodiment of the present technology, since the photosensitive rib 121 and the semiconductor chip 200 are bonded by the adhesive resin 122, the photosensitive rib 121 can be completely cured in advance before the transparent member 110 is placed.

[Fourth Modification]

In the third modification of the first embodiment described above, the photosensitive rib 121 and the semiconductor chip 200 are bonded by the adhesive resin 122, but there is a possibility that a phenomenon in which a liquid additive in the adhesive resin 122 leaks out (that is, bleed) occurs, and the liquid enters the pixel. The semiconductor package 100 according to a fourth modification of the first embodiment is different from that of the first embodiment in preventing intrusion of bleed into a pixel by a stopper.

Figure 15:
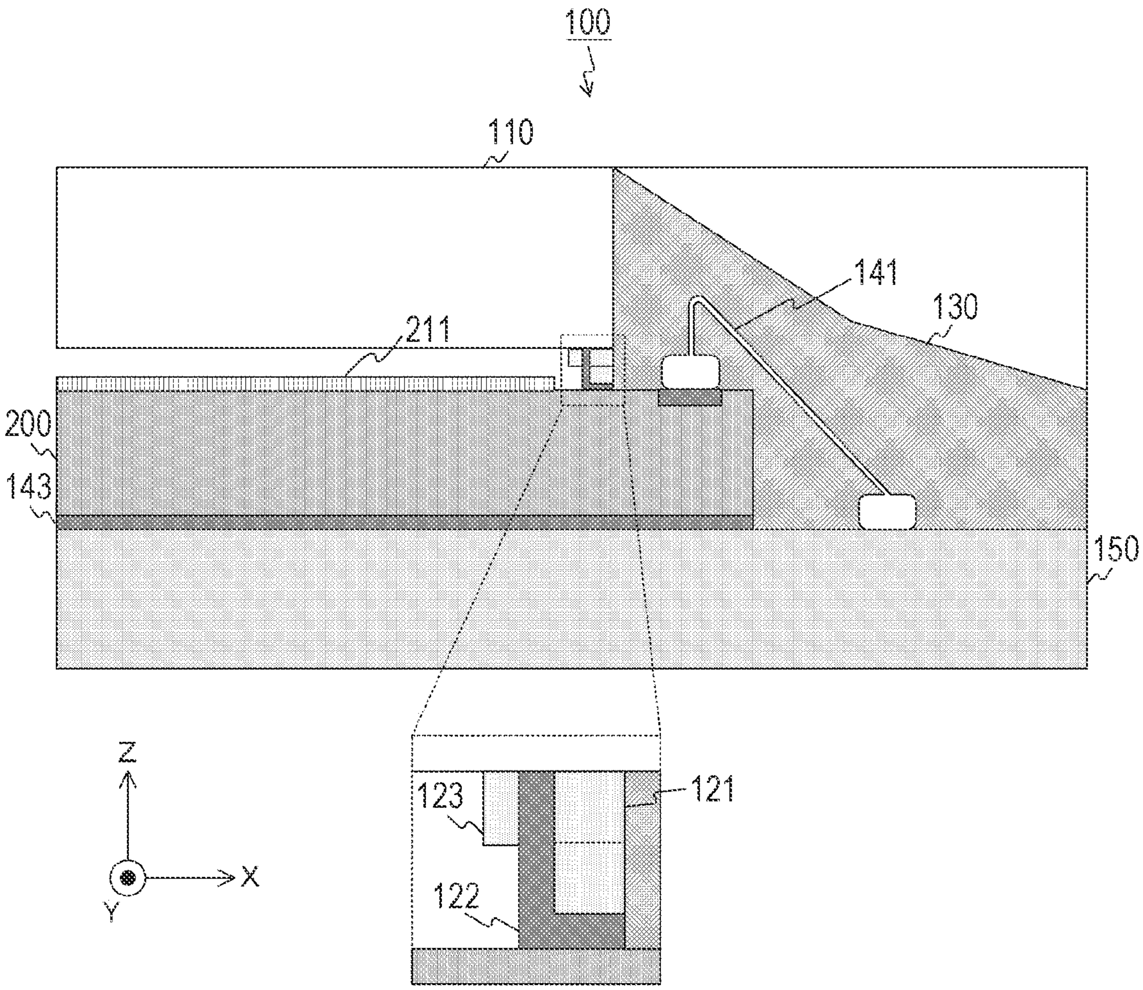
FIG. 15 is an example of a cross-sectional view of a semiconductor package according to a fourth modification of the first embodiment of the present technology.

FIG. 15 is an example of a cross-sectional view of the semiconductor package 100 according to the fourth modification of the first embodiment of the present technology. A stopper 123 is further formed on the lower surface of the transparent member 110 of the fourth modification of the first embodiment.

The stopper 123 is a photosensitive resin formed between the region facing the pixel 211 on the lower surface of the transparent member 110 and the photosensitive rib 121. The stopper 123 can prevent the intrusion of bleed into the pixel. Furthermore, in the fourth modification of the first embodiment, the photosensitive rib 121 having a larger size in the Z-axis direction than the stopper 123 is formed by applying the photosensitive resin a plurality of times and repeating exposure and development.

Figure 16:
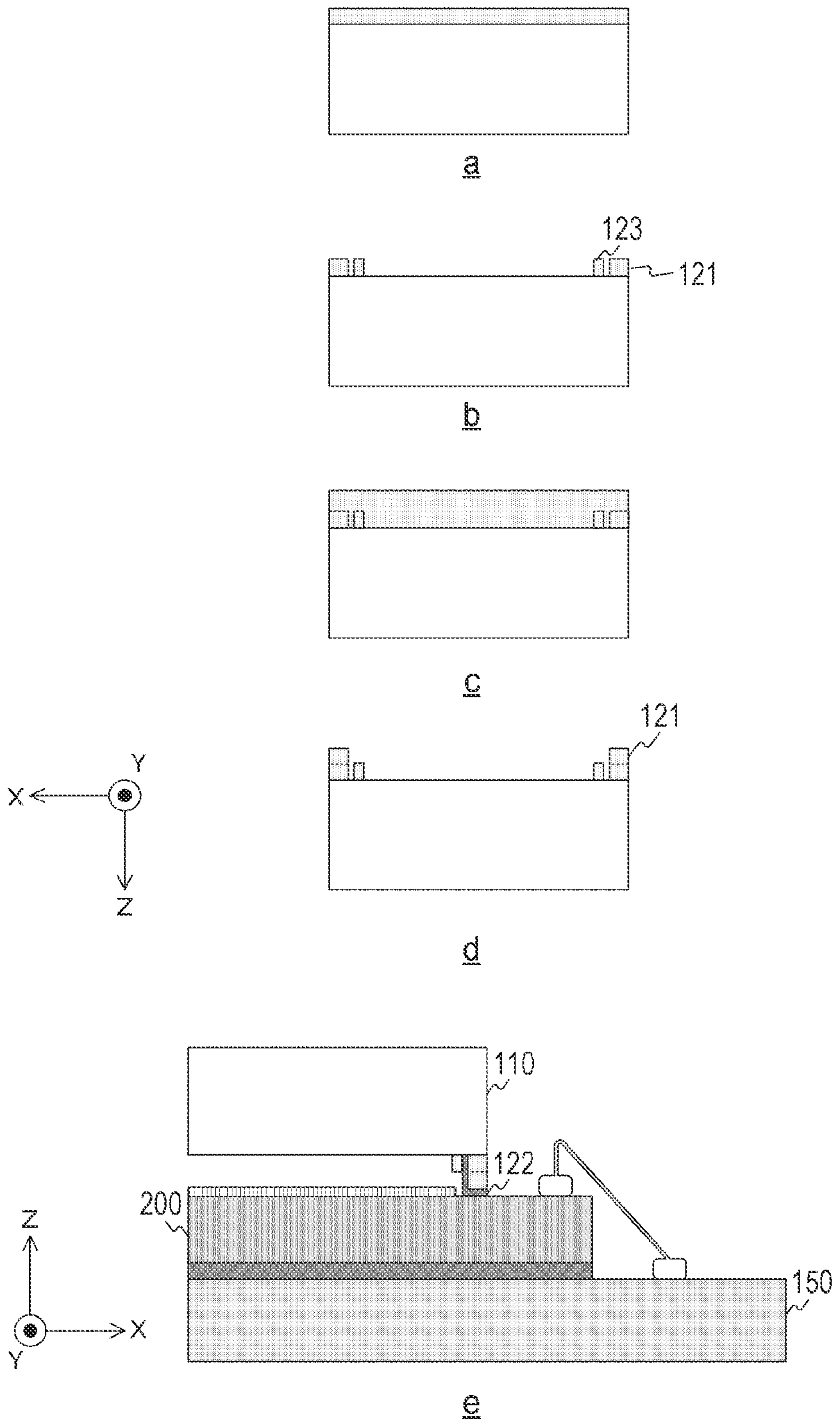
FIG. 16 is a view for describing a manufacturing method up to placement of the transparent member according to the fourth modification of the first embodiment of the present technology.

FIG. 16 is a view for describing a manufacturing method up to the placement of the transparent member 110 according to the fourth modification of the first embodiment of the present technology.

As illustrated in a of the drawing, the manufacturing system applies the photosensitive resin to the upper surface of the glass wafer. A gray portion in a of the drawing indicates the photosensitive resin. As illustrated in b of the drawing, the manufacturing system exposes and develops portions other than the stopper 123 and the lower portion of the photosensitive rib 121 by masking. Moreover, the manufacturing system performs hard baking to fully cure the photosensitive resin. Thus, the stopper 123 and the lower portion of the photosensitive rib 121 are formed.

Then, the manufacturing system applies the photosensitive resin again as illustrated in c of the drawing. As illustrated in d of the drawing, the manufacturing system masks a portion other than the upper portion of the photosensitive rib 121, exposes the portion, and develops the portion. Moreover, the manufacturing system performs hard baking to fully cure the photosensitive resin. Thus, the upper portion of the photosensitive rib 121 is formed.

Then, the manufacturing system divides the glass wafer for each chip, and places the transparent member 110 on the semiconductor chip 200 upside down as illustrated in e of the drawing. Then, the manufacturing system performs permeation adhesion using the adhesive resin 122.

Note that the manufacturing system performs the steps from application of the photosensitive resin to exposure and development twice, but can also perform the steps three times or more.

Figure 17:
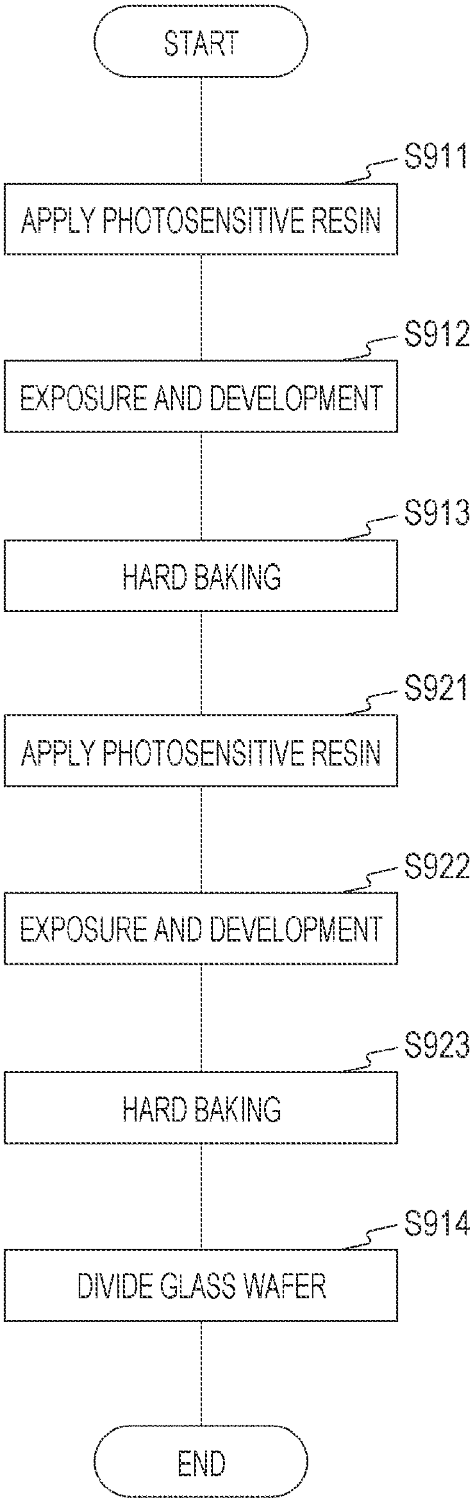
FIG. 17 is an example of a flowchart illustrating the method for manufacturing a transparent member according to the fourth modification of the first embodiment of the present technology.

FIG. 17 is an example of a flowchart illustrating the method for manufacturing the transparent member 110 according to the fourth modification of the first embodiment of the present technology.

The manufacturing system applies the photosensitive resin to the upper surface of the glass wafer (step S911), and performs exposure and development (step S912). The manufacturing system performs hard baking to completely cure the photosensitive resin (step S913).

Then, the manufacturing system applies the photosensitive resin again (step S921), and performs exposure and development (step S922). Moreover, the manufacturing system performs hard baking (step S923) and divides the glass wafer for each chip (step S914).

As described above, according to the fourth modification of the first embodiment of the present technology, since the stopper 123 is formed between the region facing the pixel 211 on the lower surface of the transparent member 110 and the photosensitive rib 121, intrusion of bleed into the pixel 211 can be suppressed.

2. Second Embodiment

In the first embodiment described above, an organic film is not formed in the semiconductor chip 200, but a photoelectric conversion film, a microlens, or the like of a pixel can be formed by an organic film. However, since the organic film generally has weaker adhesion than the inorganic film, the organic film at the portion where the photosensitive rib 121 is formed may be peeled off by stress. The semiconductor package 100 of the second embodiment is different from that of the first embodiment in that an organic film under the photosensitive rib 121 is removed.

Figure 18:
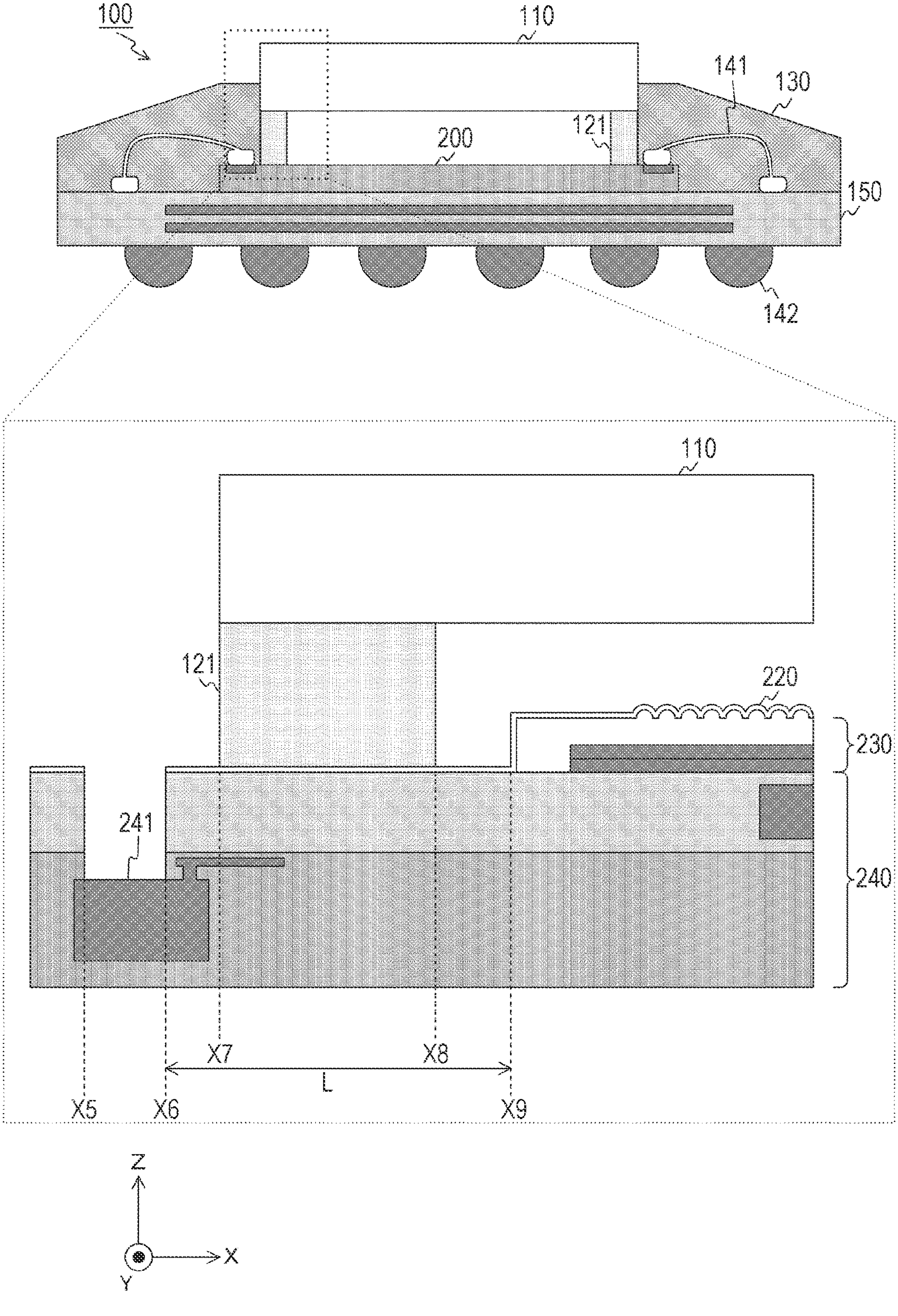
FIG. 18 is an example of a cross-sectional view of a semiconductor package according to a second embodiment of the present technology.

FIG. 18 is an example of a cross-sectional view of the semiconductor package 100 according to the second embodiment of the present technology. In the enlarged view on the lower side of the drawing, the sealing resin 130 and the wire 141 are omitted.

The semiconductor chip 200 of the second embodiment includes a silicon substrate 240 and an organic film 230. The organic film 230 is formed on a part of the substrate surface of the silicon substrate 240. The organic film 230 includes an optical portion (such as a microlens) and a photoelectric conversion portion in the pixel. A pad 241 for wire bonding is formed on the silicon substrate 240, and an upper portion of the pad 241 from a coordinate X5 to a coordinate X6 on the substrate surface is opened in the Z-axis direction. The organic film 230 and the silicon substrate 240 are covered with an inorganic film 220 of silicon dioxide ($SiO_2$) or the like.

Furthermore, the photosensitive rib 121 of the second embodiment is disposed between a region of the substrate surface of the silicon substrate 240 where the organic film 230 is not formed and the transparent member 110. For example, the organic film 230 is not formed in a region from a coordinate X6 at the left end of the opening to a coordinate X9. The photosensitive rib 121 is disposed in a range from a coordinate X7 to a coordinate X8 in this region.

A distance L from an end (such as X6) of the opening to the organic film 230 is set to, for example, 200 micrometers (μm) or more.

Here, a second comparative example in which the organic film 230 is formed at the bonded portion of the photosensitive rib 121 is assumed.

Figure 19:
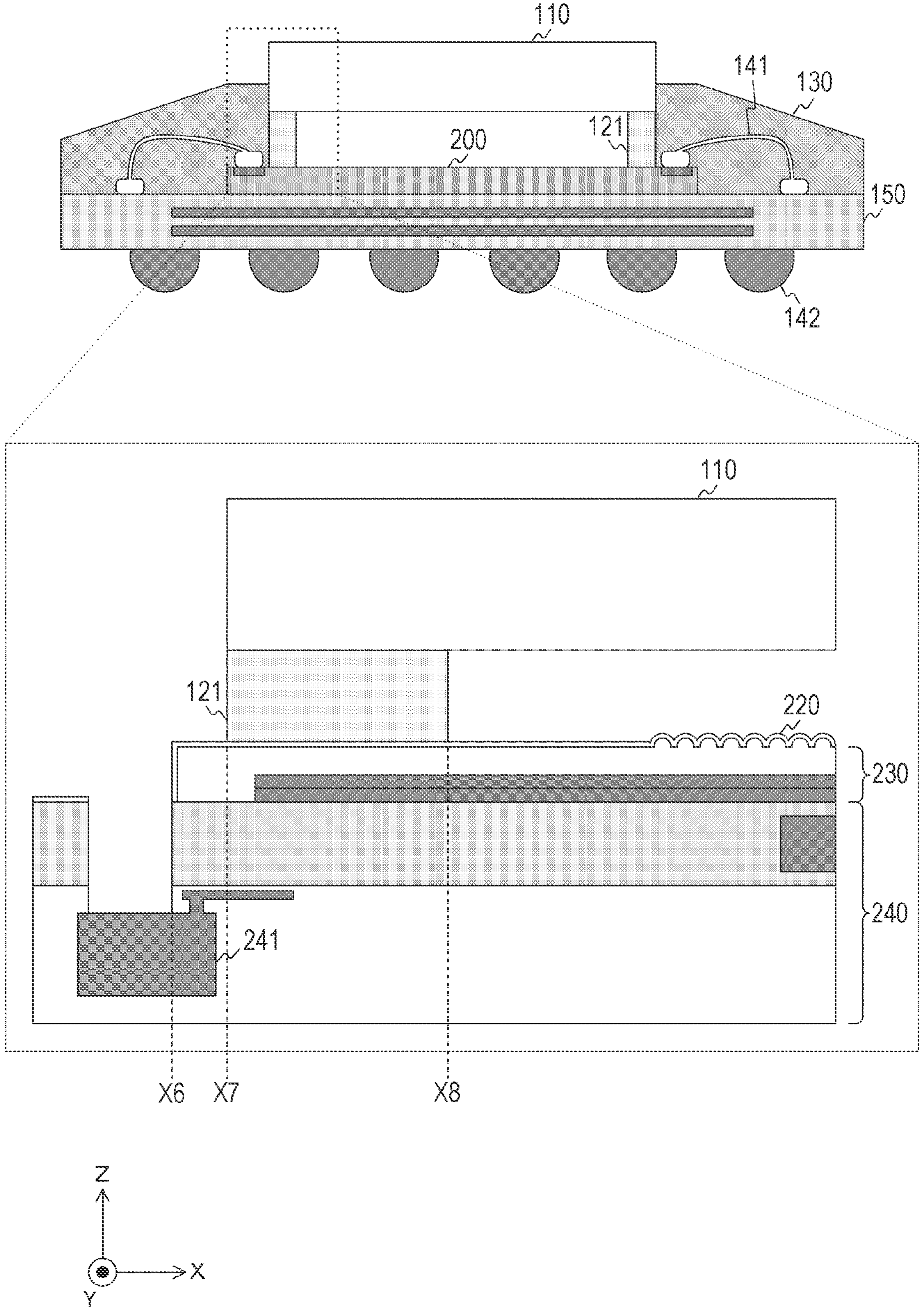
FIG. 19 is an example of a cross-sectional view of a semiconductor package in a second comparative example.

FIG. 19 is an example of a cross-sectional view of a semiconductor package in a second comparative example. In the second comparative example, the organic film 230 is formed in a range from the coordinate X6 of the left end of the left opening to the right end (not illustrated) of the right opening. The photosensitive rib 121 is bonded to the organic film 230. In general, since the organic film has weaker adhesion than the inorganic film, the organic film 230 may be peeled off by stress generated at the bonded portion of the photosensitive rib 121 in the structure of the drawing.

On the other hand, in the semiconductor package 100 illustrated in FIG. 18, since the photosensitive rib 121 at the bonded portion of the photosensitive rib 121 is removed, it is possible to avoid a defect due to peeling of the organic film 230.

Figure 20:
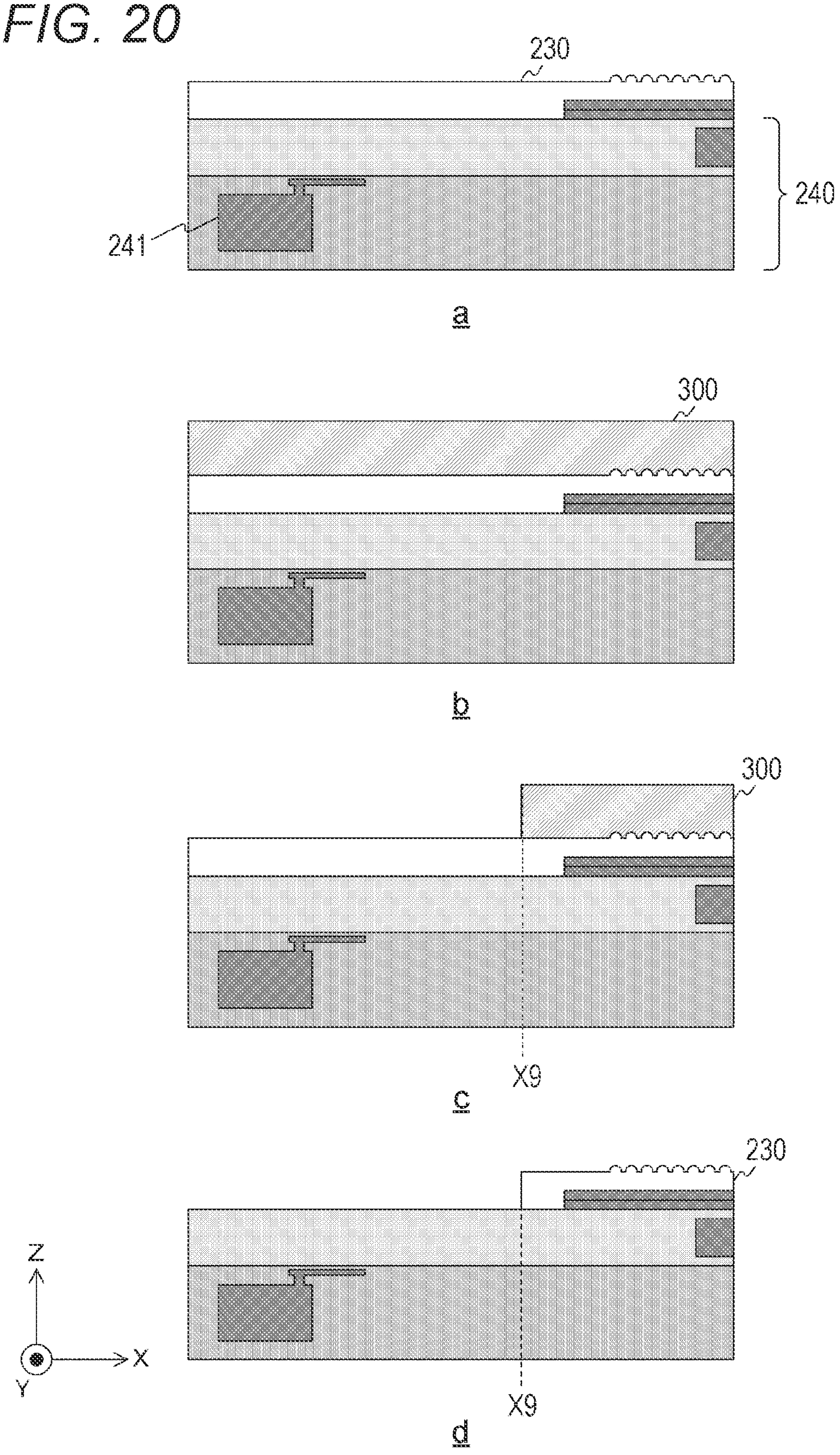
FIG. 20 is a view for describing steps up to resist removal according to the second embodiment of the present technology.

FIG. 20 is a view for describing steps up to resist removal according to the second embodiment of the present technology. As illustrated in a of the drawing, the manufacturing system forms a wafer having the organic film 230 formed on the entire surface by a normal CMOS image sensors (CIS) process.

As illustrated in b of the drawing, the manufacturing system applies a resist 300 to the entire wafer. Then, as illustrated in c of the drawing, the manufacturing system removes the resist 300 around the pad 241 by etching and cleaning. For example, the resist 300 in the region on the left side of the coordinate X9 in the drawing is removed.

Subsequently, as illustrated in d of the drawing, the manufacturing system removes the organic film 230 in a region (such as the left side of the coordinate X9) from which the resist 300 has been removed by etching and cleaning.

Figure 21:
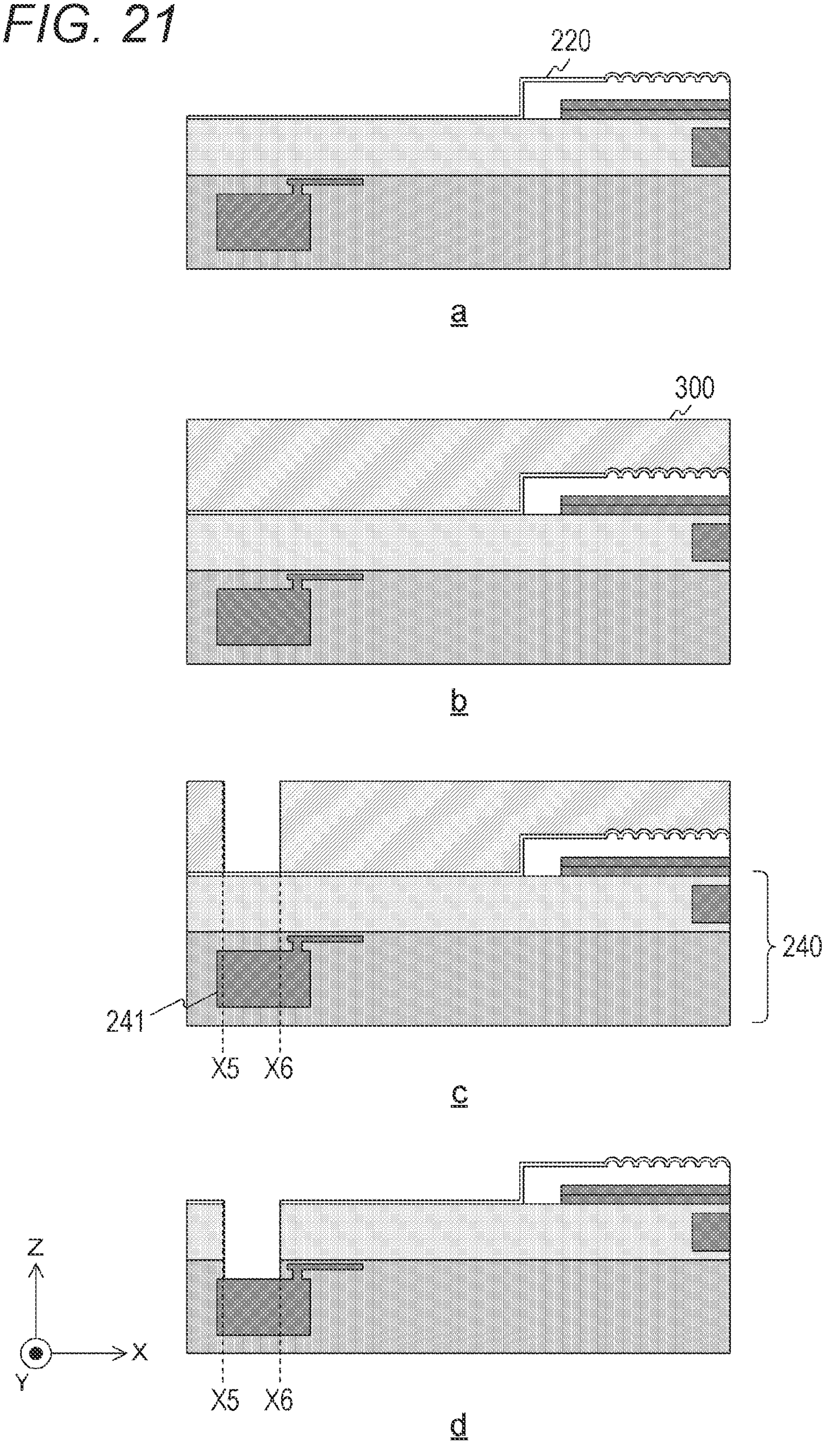
FIG. 21 is a view for describing steps up to an opening of a silicon substrate according to the second embodiment of the present technology.

FIG. 21 is a view for describing steps up to the opening of the silicon substrate according to the second embodiment of the present technology. The step in the drawing is executed after the step of removing the organic film 230.

The manufacturing system forms the inorganic film 220 on the entire surface as illustrated in a of the drawing. Then, as illustrated in b of the drawing, the manufacturing system applies the resist 300.

Subsequently, as illustrated in c of the drawing, the manufacturing system patterns only the upper portion of the pad (the region from the coordinate X5 to the coordinate X6), and opens the upper portion of the pad by etching as illustrated in d of the drawing.

After the steps illustrated in FIGS. 20 and 21, the wafers are singulated, and the steps after b in FIG. 5 are executed.

As described above, according to the second embodiment of the present technology, since the organic film 230 at the bonded portion of the photosensitive rib 121 is removed, it is possible to avoid a defect due to peeling of the organic film 230.

3. Third Embodiment

In the first embodiment described above, the photosensitive rib 121 is formed around the region facing the pixel on the lower surface of the transparent member 110, but reflection of light around the pixel enters the pixel, and optical characteristics of the pixel may be deteriorated. The semiconductor package 100 according to a third embodiment is different from that of the first embodiment in that inner walls of the photosensitive rib 121 are jagged to improve optical characteristics.

Figure 22:
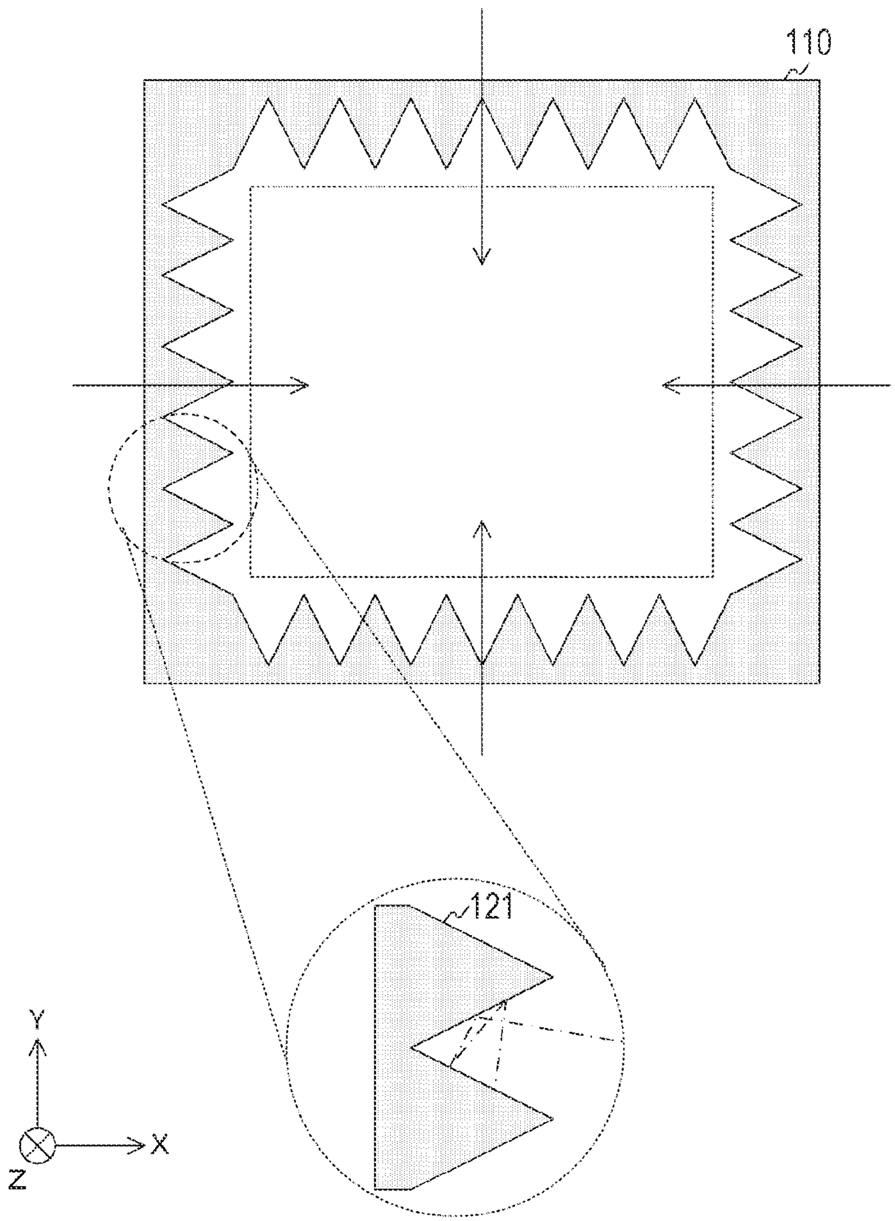
FIG. 22 is an example of a bottom view of a transparent member according to a third embodiment of the present technology.

FIG. 22 is an example of a bottom view of the transparent member 110 according to the third embodiment of the present technology. A rectangular region surrounded by a dotted line in the drawing indicates the region facing the pixel 211 (not illustrated). A direction toward the pixels 211 is referred to as an "inner direction". An arrow in the drawing indicates an inner direction. Furthermore, the gray portion indicates a region where the photosensitive rib 121 is formed. Of the side walls of the photosensitive rib 121, an inner wall surface is referred to as an "inner wall", and an outer wall surface is referred to as an "outer wall".

In the third embodiment, a plurality of triangular indentations is formed in the inner walls of the photosensitive rib 121. Due to these indentations, the inner walls of the photosensitive rib 121 have a shape in which a plurality of triangular prisms is connected. In other words, the inner walls of the photosensitive rib 121 are jagged when viewed from the Z-axis direction.

By the inner walls of the photosensitive rib 121 having a shape in which a plurality of triangular prisms is connected, light is attenuated in an indentation between the triangular prisms, and reflected light is reduced. Thus, the optical characteristics of the pixel can be improved. An alternate long and short dash line in the drawing indicates an optical path of the reflected light.

Figure 23:
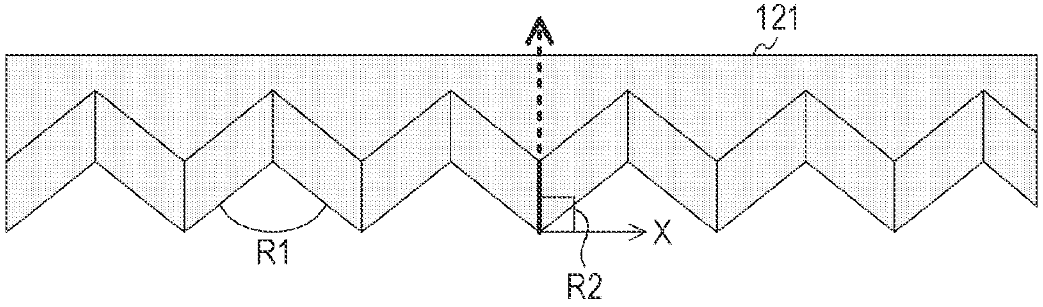
FIG. 23 is an example of a perspective view of a photosensitive rib according to the third embodiment of the present technology.
Figure 23:
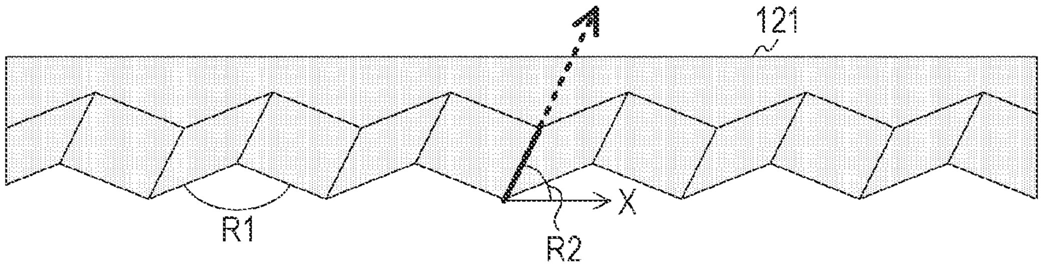

FIG. 23 is an example of a perspective view of the photosensitive rib 121 according to the third embodiment of the present technology. An angle R1 formed by the triangular indentation formed in the inner wall is, for example, equal to or less than 90 degrees. Furthermore, a thick line in the drawing is a line segment connecting a vertex of a lower surface of the triangular prism formed by the indentation and a vertex of an upper surface thereof. A dotted arrow indicates the direction of a straight line (that is, a generatrix in the triangle) along this line segment. An angle R2 formed by the generatrix and an axis (such as the X axis) parallel to the plane of the transparent member 110 is, for example, 90 degrees as illustrated in a of the drawing.

Note that, as illustrated in b of the drawing, the generatrix of the triangular prism can be inclined, and the angle R2 formed by the generatrix and the axis (such as the X axis) parallel to the plane may be set to an angle other than 90 degrees. Such an inclined prism is called an oblique prism.

Figure 24:
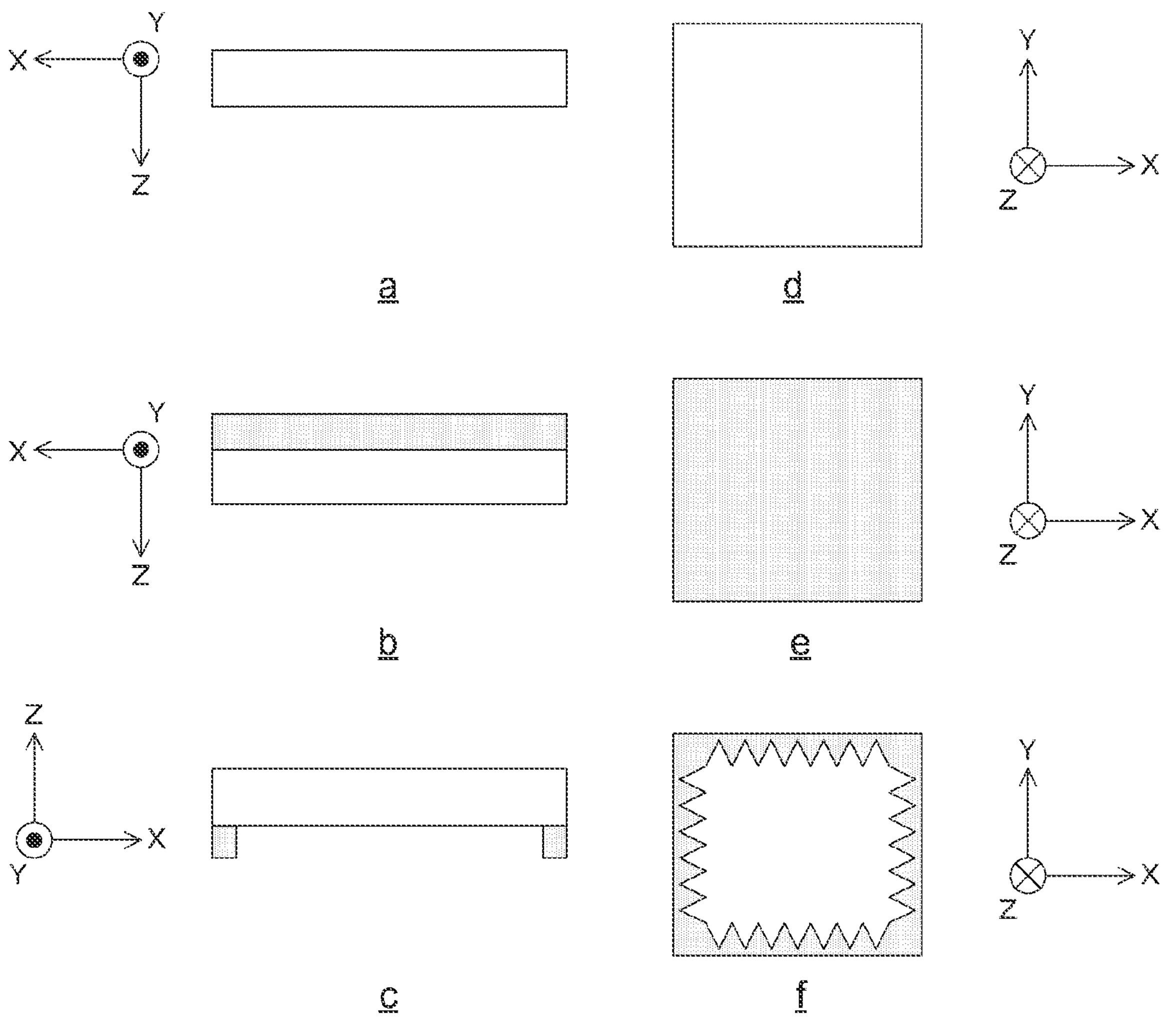
FIG. 24 is a view for describing a method for manufacturing the transparent member according to the third embodiment of the present technology.

FIG. 24 is a view for describing a method for manufacturing the transparent member 110 according to the third embodiment of the present technology. The manufacturing system places a glass wafer to be the transparent member 110 as illustrated in a of the drawing, and applies the photosensitive resin to an upper surface of the glass wafer as illustrated in b of the drawing. A gray portion in the drawing indicates the photosensitive resin. Then, as illustrated in c of the drawing, the manufacturing system patterns the photosensitive rib 121 by exposure and development, and turns the photosensitive rib upside down. After the steps in the drawing, steps d and subsequent steps in FIG. 5 are executed.

d, e, and f in the drawing are examples of portions to be singulated in planes of the glass wafer of a, b, and c in the drawing. As illustrated in f of the drawing, the photosensitive rib 121 having a jagged inner wall is formed at the time of patterning.

Note that the second embodiment can be applied to the third embodiment.

As described above, according to the third embodiment of the present technology, since the inner wall of the photosensitive rib 121 has a shape in which a plurality of triangular prisms is connected, reflected light can be reduced to improve optical characteristics of the pixel.

[Modification]

In the third embodiment described above, the inner wall of the photosensitive rib 121 can be jagged, but the outer wall may be further jagged. The semiconductor package 100 according to a modification of the third embodiment is different from that of the third embodiment in that an outer wall of the photosensitive rib 121 is also jagged.

Figure 25:
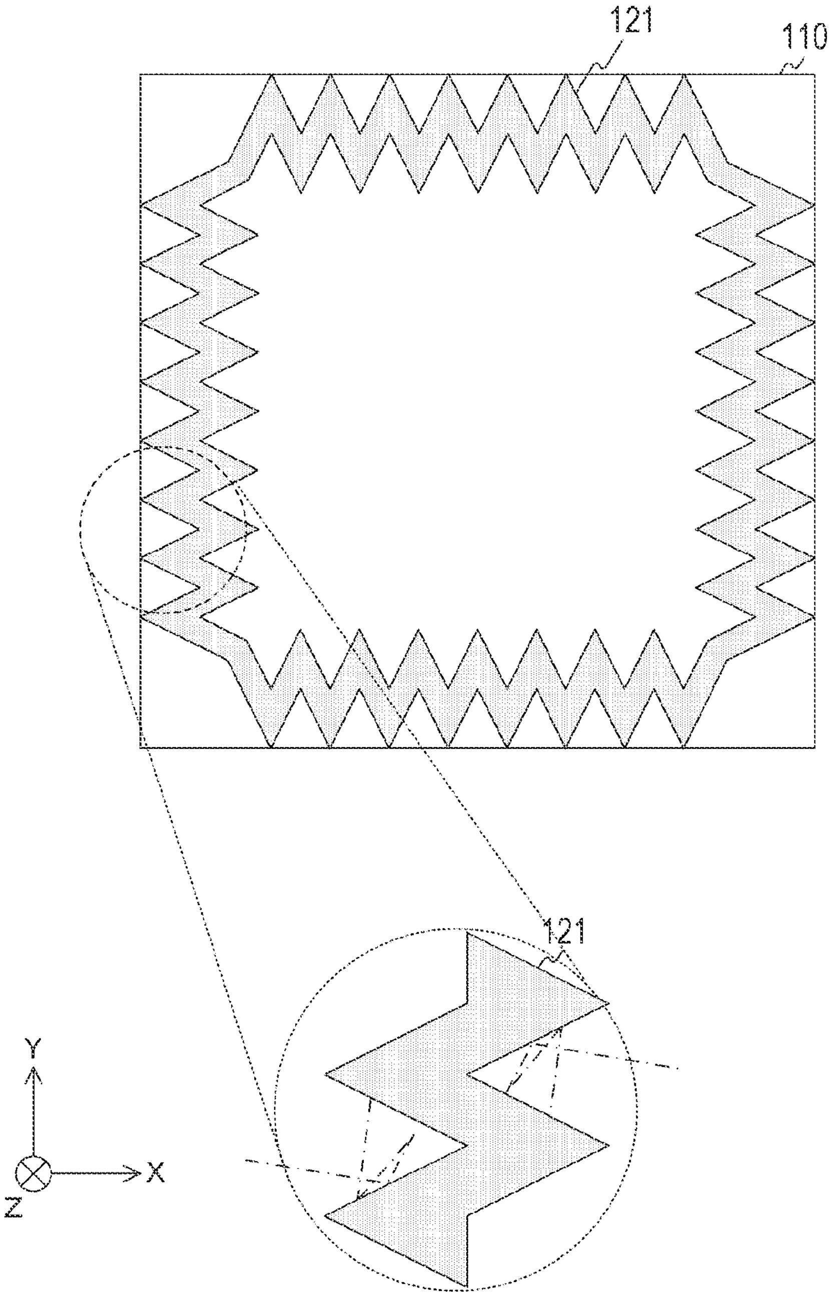
FIG. 25 is an example of a bottom view of a transparent member according to a modification of the third embodiment of the present technology.

FIG. 25 is an example of a bottom view of the transparent member 110 according to the modification of the third embodiment of the present technology. The transparent member 110 according to a modification of the third embodiment is different from that of the third embodiment in that an outer wall with respect to an inner wall of the photosensitive rib 121 has a shape in which a plurality of triangular prisms is connected. By making the outer wall jagged, unnecessary light from the outside is attenuated in the indentation of the outer wall, and the optical characteristics can be further improved.

As described above, according to the modification of the third embodiment of the present technology, since the outer wall of the photosensitive rib 121 has a shape in which a plurality of triangular prisms is connected, light from the outside can be reduced, and the optical characteristics of the pixel can be further improved.

4. Fourth Embodiment

In the first embodiment described above, sealing is performed with the sealing resin 130, but in order to suppress flare, a light shielding film can be formed on the upper surface of the transparent member 110 using a part of the sealing resin 130. However, when the light shielding film is formed by the sealing resin 130, the sealing resin 130 may protrude to a region immediately above the pixel, and the light shielding film cannot be formed in a desired shape. The semiconductor package 100 according to a fourth embodiment is different from that of the first embodiment in that a dam is formed on the upper surface of the transparent member 110 to prevent protrusion of resin.

Figure 26:
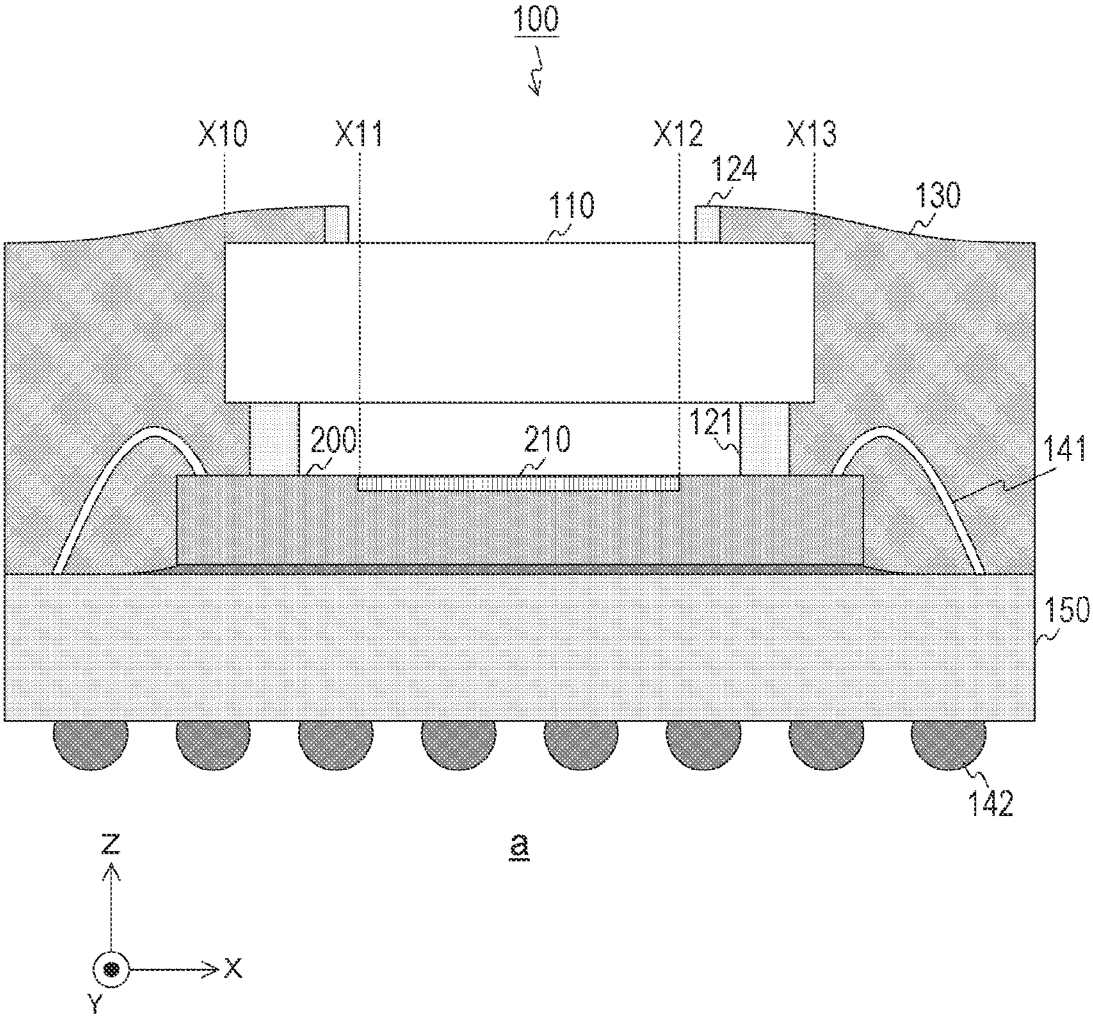
FIG. 26 is an example of a cross-sectional view and a plan view of a semiconductor package according to a fourth embodiment of the present technology.
Figure 26:
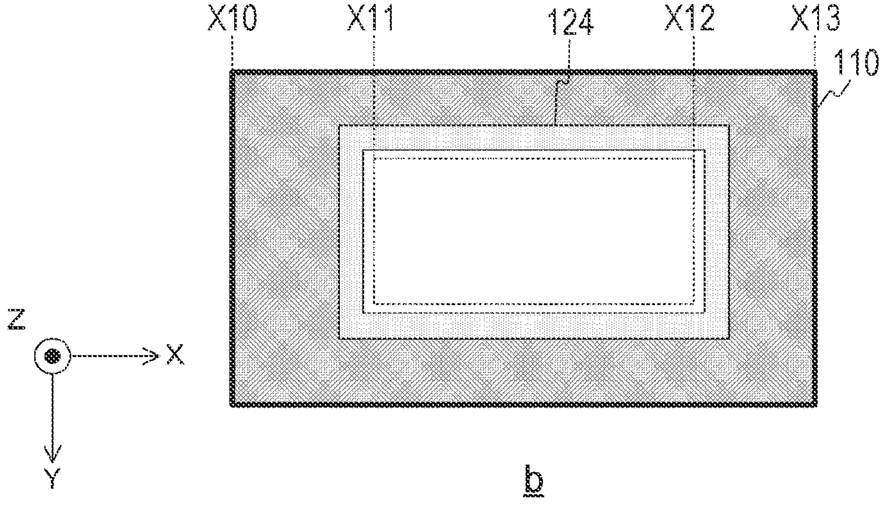

FIG. 26 is an example of a cross-sectional view and a plan view of the semiconductor package 100 according to the fourth embodiment of the present technology. In the drawing, a illustrates a cross-sectional view of the semiconductor package 100, and b illustrates a top view of the transparent member 110.

As illustrated in a of the drawing, the semiconductor package 100 of the fourth embodiment is different from that of the first embodiment in that a dam 124 is formed on the upper surface of the transparent member 110. In the upper surface of the transparent member 110, a rectangular region immediately above the imaging unit 210 is defined as a light receiving region.

As illustrated in b of the drawing, the dam 124 is formed around the light receiving region by the photosensitive resin. A region surrounded by a dotted line in b in the drawing indicates a light receiving region, and a light gray region indicates the dam 124. Furthermore, a part of the sealing resin 130 covers a region between the outer periphery of the transparent member 110 and the dam 124, and the part functions as a light shielding film. A thick line in b of the drawing indicates the outer periphery of the transparent member 110.

For example, in the X-axis direction, a coordinate of a left end of the transparent member is set to X10, and a coordinate of a right end thereof is set to X13. Furthermore, a coordinate of a left end of the imaging unit 210 is set to X11, and a coordinate of a right end thereof is set to X12. The dam 124 is formed in a region from the coordinate X10 to the coordinate X11 and a region from the coordinate X12 to the coordinate X13. The sealing resin 130 covers from the coordinate X10 to the dam 124 and from the coordinate X13 to the dam 124 on the upper surface of the transparent member 110 to shield light.

As illustrated in the drawing, by shielding the vicinity of the outer periphery of the transparent member 110 with the sealing resin 130, it is possible to prevent flare in which stray light reflected by a member other than the semiconductor chip 200 at the end of the angle of view is incident on the semiconductor chip 200.

Here, a configuration in which the dam 124 is not formed on the upper surface of the transparent member 110 is assumed as a third comparative example.

Figure 27:
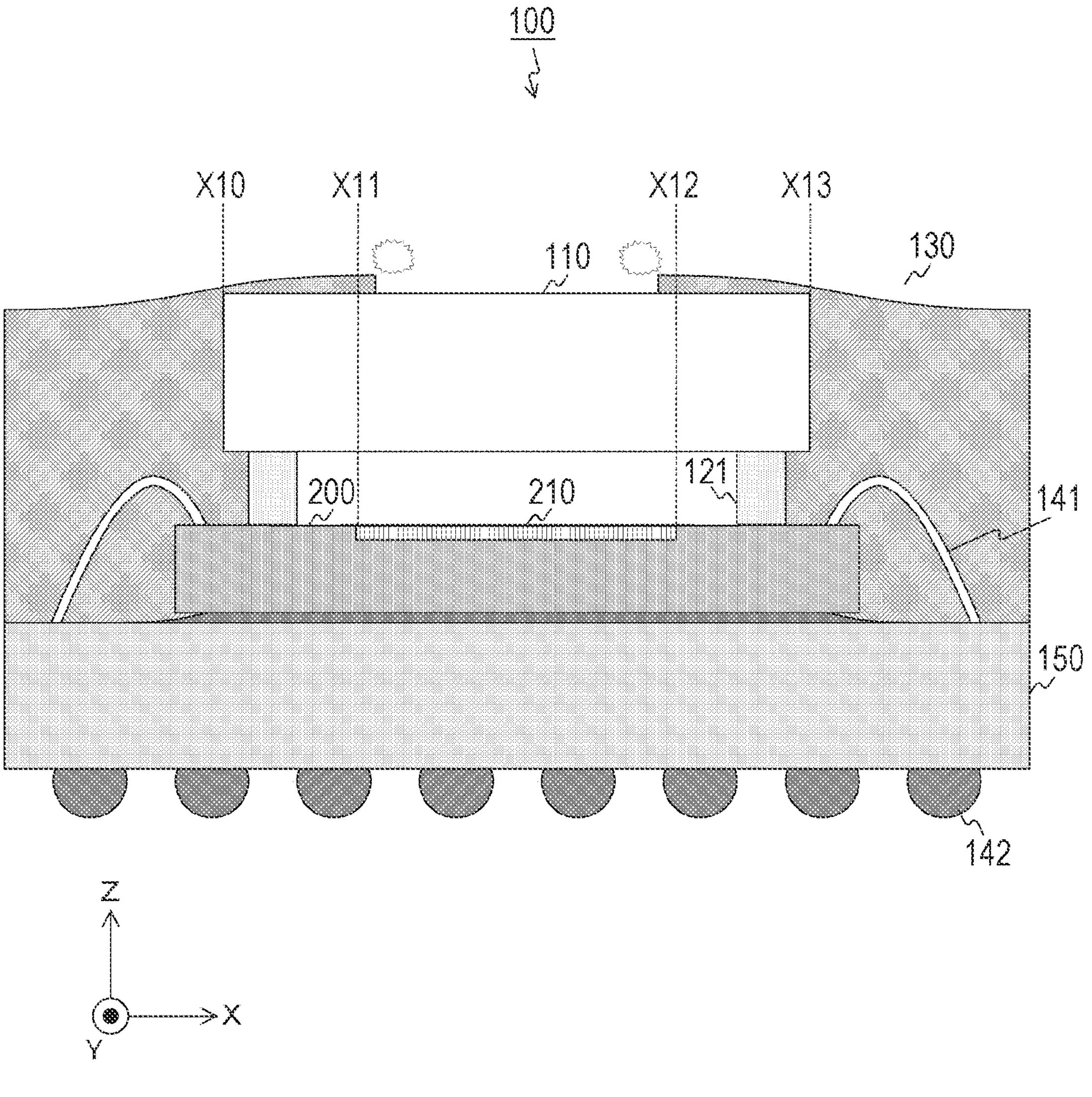
FIG. 27 is an example of a cross-sectional view of a semiconductor package in a third comparative example.

FIG. 27 is an example of a cross-sectional view of a semiconductor package in a third comparative example. In the third comparative example, when the sealing resin 130 is formed, the sealing resin 130 may protrude to the light receiving region to cause vignetting.

On the other hand, in the fourth embodiment illustrated in FIG. 26, since the dam 124 is formed around the light receiving region, it is possible to prevent the sealing resin 130 from protruding to the light receiving region. Thus, vignetting can be suppressed.

Figure 28:
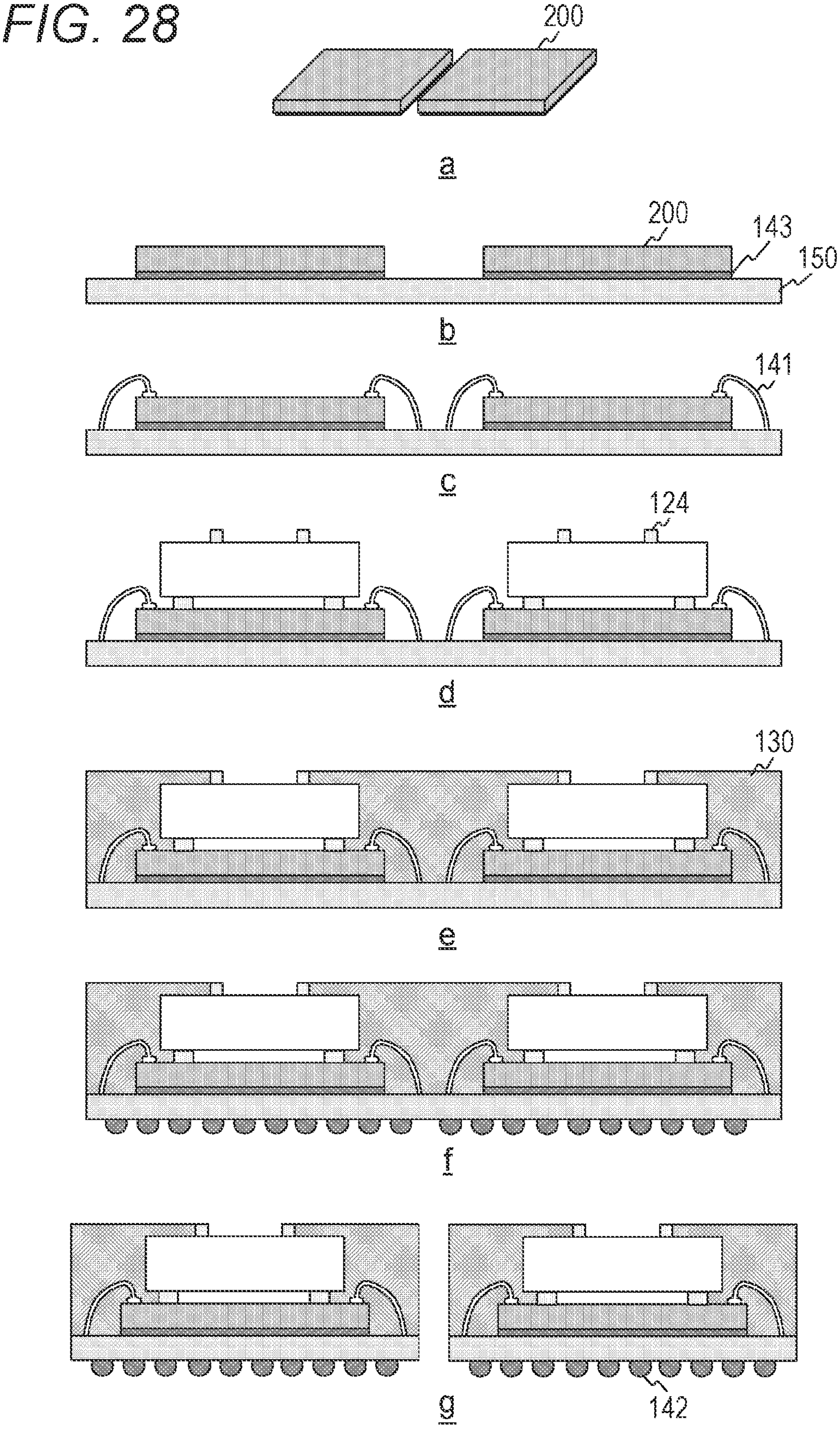
FIG. 28 is a view for describing a method for manufacturing the semiconductor package according to the fourth embodiment of the present technology.

FIG. 28 is a view for describing a method for manufacturing the semiconductor package 100 according to the fourth embodiment of the present technology. The manufacturing system manufactures a plurality of semiconductor chips 200 as illustrated in a of the drawing, and die- bonds the semiconductor chips to the interposer 150 as illustrated in b of the drawing.

Then, as illustrated in c of the drawing, the manufacturing system electrically connects each of the semiconductor chips 200 and the interposer 150. As illustrated in d of the drawing, the manufacturing system places the transparent member 110 having the photosensitive rib 121 formed on the lower surface on the upper surface of the semiconductor chip 200, and forms the dam 124 on the upper surface of the transparent member 110 with the photosensitive resin.

Then, the manufacturing system performs sealing with the sealing resin 130 as illustrated in e of the drawing. At this time, a part of the sealing resin 130 covers the vicinity of the outer periphery of the transparent member 110 and shields light.

The manufacturing system attaches each of the solder balls 142 to the lower surface of the interposer 150 as illustrated in f of the drawing, and singulates the solder balls as illustrated in g of the drawing.

Note that the second and third embodiments can also be applied to the fourth embodiment.

As described above, according to the fourth embodiment of the present technology, since the dam 124 is formed around the light receiving region on the upper surface of the transparent member 110, when light is shielded by the sealing resin 130, it is possible to prevent the resin from protruding to the light receiving region.

[Modification]

In the above-described fourth embodiment, the light shielding film is formed by the sealing resin 130, but the light shielding film can be formed by the molding resin 160. The semiconductor package 100 according to a modification of the fourth embodiment is different from that of the fourth embodiment in that the light shielding film is formed by the molding resin 160.

Figure 29:
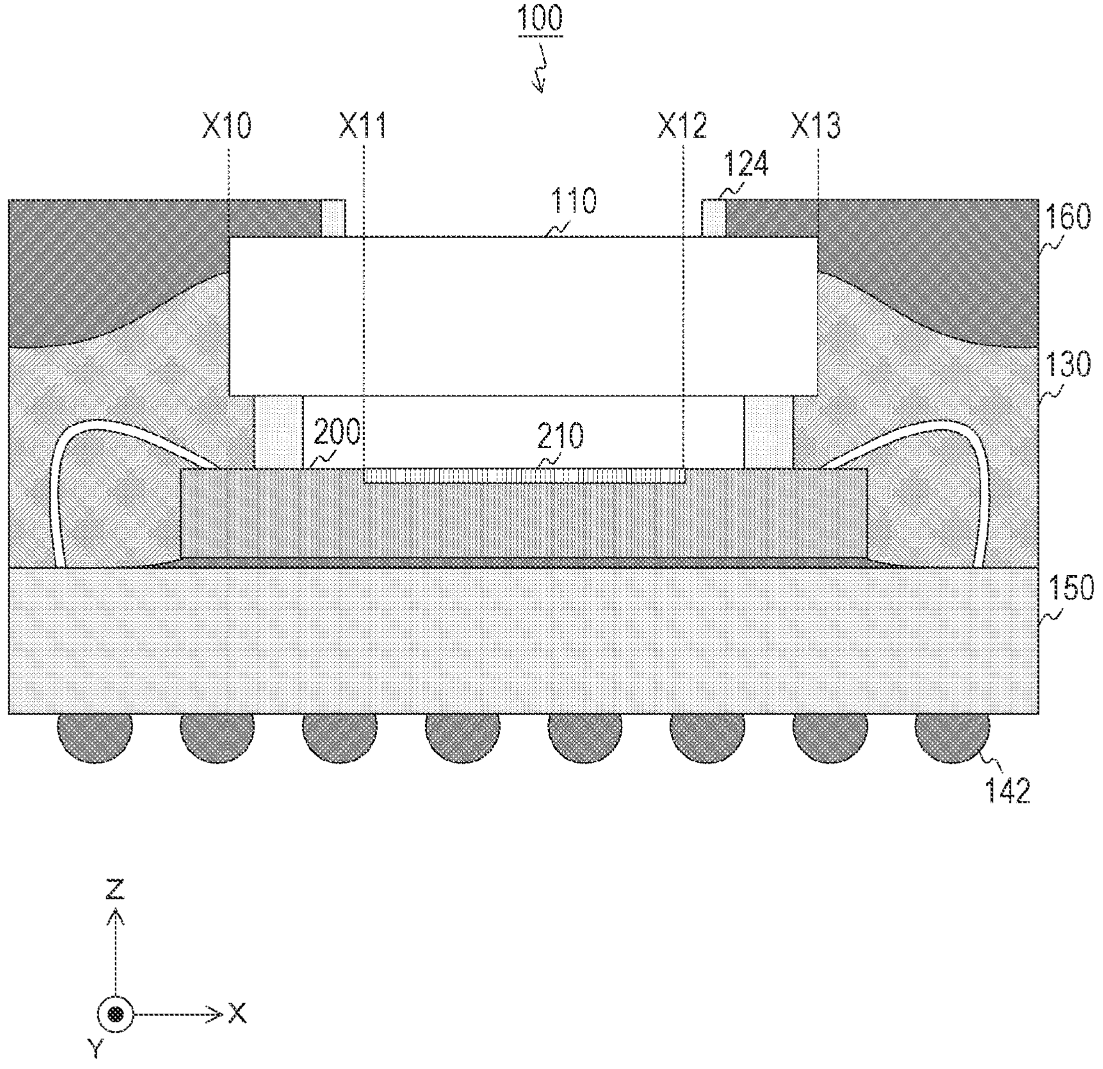
FIG. 29 is an example of a cross-sectional view of a semiconductor package according to a modification of the fourth embodiment of the present technology.

FIG. 29 is an example of a cross-sectional view of the semiconductor package 100 according to the modification of the fourth embodiment of the present technology. The semiconductor package 100 according to the modification of the fourth embodiment is different from that of the fourth embodiment in that the molding resin 160 is further formed.

In the modification of the fourth embodiment, the sealing resin 130 does not cover the upper surface of the transparent member 110. Instead, a part of the molding resin 160 covers a region between the outer periphery of the transparent member 110 and the dam 124, and the part functions as a light shielding film.

As described above, according to the modification of the fourth embodiment of the present technology, since the dam 124 is formed around the light receiving region on the upper surface of the transparent member 110, when light is shielded by the molding resin 160, it is possible to prevent the resin from protruding to the light receiving region.

Note that, the embodiments described above each describe an example for embodying the present technology, and matters in the embodiments and matters specifying the invention in the claims have correspondence relationships. Similarly, the matters specifying the invention in the claims and the matters in the embodiments of the present technology denoted by the same names have correspondence relationships. However, the present technology is not limited to the embodiments, and can be embodied by subjecting the embodiments to various modifications without departing from the gist thereof.

Note that, the advantageous effects described in the specification are merely examples, and the advantageous effects of the present technology are not limited to them and may include other effects.

Note that, the present technology can also be configured as described below.

(1) A semiconductor package, including:

a transparent member;

a semiconductor chip in which pixels are arranged on a part of a chip plane;

a photosensitive rib that is a photosensitive resin disposed between a region not corresponding to the pixel in the chip plane and the transparent member; and an interposer electrically connected to the semiconductor chip.

(2) The semiconductor package according to (1) above, in which an adhesive resin that bonds the photosensitive rib and the semiconductor chip.

(3) The semiconductor package according to (2) above, further including:

a stopper, in which the semiconductor chip is disposed between the transparent member and the interposer, the photosensitive rib is formed around a predetermined region facing the pixel on a lower surface of the transparent member where a direction from the interposer to the transparent member is set as an upward direction, and the stopper is formed between the predetermined region of the lower surface and the photosensitive rib.

(4) The semiconductor package according to (1) above, in which the photosensitive rib is formed in close contact with both the transparent member and the semiconductor chip.

(5) The semiconductor package according to any one of (1) to (4) above, in which the transparent member is a lens.

(6) The semiconductor package according to any one of (1) to (5) above, in which a cross-sectional shape of the photosensitive rib is a tapered shape.

(7) The semiconductor package according to any one of (1) to (6) above, in which the semiconductor chip includes a silicon substrate, and an organic film formed on a part of a substrate surface of the silicon substrate, in which the photosensitive rib is disposed between a region of the substrate surface where the organic film is not formed and the transparent member.

(8) The semiconductor package according to (7) above, in which the semiconductor chip has an opening, and a distance from an end of the opening to the organic film is not less than 200 micrometers.

(9) The semiconductor package according to any one of (1) to (8) above, in which a shape of an inner wall of the photosensitive rib is a shape obtained by connecting a plurality of triangular prisms with a direction toward the pixel as an inner direction.

(10) The semiconductor package according to (9) above, in which a shape of an outer wall of the photosensitive rib with respect to an inner wall is a shape in which a plurality of triangular prisms is connected.

(11) The semiconductor package according to any one of (1) to (10) above, further including:

a dam; and a sealing resin that seals the semiconductor chip, the transparent member, and the interposer, in which the semiconductor chip is disposed between the transparent member and the interposer, and the dam is formed around a light receiving region immediately above the pixel on an upper surface of the transparent member where a direction from the interposer to the transparent member is set as an upward direction.

(12) The semiconductor package according to (11) above, in which a part of the sealing resin shields a region between an outer periphery of the transparent member and the dam in the upper surface of the transparent member.

(13) The semiconductor package according to (11) above, further including:

a molding resin that shields a region between an outer periphery of the transparent member and the dam in the upper surface of the transparent member.

(14) A method for manufacturing a semiconductor package, the method including:

a connection procedure of electrically connecting a semiconductor chip in which pixels are arranged on a part of a predetermined chip plane and an interposer;

a photosensitive rib forming procedure of forming a photosensitive resin as a photosensitive rib in a region of one of both surfaces of a transparent member, the region not facing the pixel; and a placement procedure of placing the transparent member on which the photosensitive rib is formed on the semiconductor chip.

(15) The method for manufacturing a semiconductor package according to (14) above, in which an application procedure of applying a resist to the semiconductor chip including a silicon substrate and an organic film formed on a substrate surface of the silicon substrate;

a resist removal procedure of removing a part of the resist; and an organic film removal procedure of removing a portion of the organic film to which the resist is not applied, in which the connection procedure is executed after the organic film removal procedure.

REFERENCE SIGNS LIST

100 Semiconductor package
110 Transparent member
111 Opening region
121 Photosensitive rib
122 Adhesive resin
123 Stopper
124 Dam
130 Sealing resin
141 Wire
142 Solder ball
143 Die attach material
150 Interposer
160 Molding resin
200 Semiconductor chip
210 Imaging unit
211 Pixel
220 Inorganic film
230 Organic film
240 Silicon substrate
241 Pad
300 Resist

What is claimed is:

1. A semiconductor package, comprising:

a transparent member;

a semiconductor chip in which pixels are arranged on a part of a chip plane;

a photosensitive rib that is a photosensitive resin disposed between a region not corresponding to the pixel in the chip plane and the transparent member;

an interposer electrically connected to the semiconductor chip;

an adhesive resin that bonds the photosensitive rib and the semiconductor chip; and a stopper, wherein the semiconductor chip is disposed between the transparent member and the interposer, the photosensitive rib is formed around a predetermined region facing the pixel on a lower surface of the transparent member where a direction from the interposer to the transparent member is set as an upward direction, and the stopper is formed between the predetermined region of the lower surface and the photosensitive rib.

2. The semiconductor package according to claim 1, wherein the transparent member is a lens.

3. The semiconductor package according to claim 1, wherein a cross-sectional shape of the photosensitive rib is a tapered shape.

4. The semiconductor package according to claim 1, wherein the semiconductor chip includes a silicon substrate, and
an organic film formed on a part of a substrate surface of the silicon substrate, and
the photosensitive rib is disposed between a region of the substrate surface where the organic film is not formed and the transparent member.

5. The semiconductor package according to claim 1, wherein
a shape of an inner wall of the photosensitive rib is a shape obtained by connecting a plurality of triangular prisms with a direction toward the pixel as an inner direction.

6. The semiconductor package according to claim 1, further comprising:
a dam; and
a sealing resin that seals the semiconductor chip, the transparent member, and the interposer, wherein
the semiconductor chip is disposed between the transparent member and the interposer, and
the dam is formed around a light receiving region immediately above the pixel on an upper surface of the transparent member where a direction from the interposer to the transparent member is set as an upward direction.

7. The semiconductor package according to claim 6, wherein
a part of the sealing resin shields a region between an outer periphery of the transparent member and the dam in the upper surface of the transparent member.

8. The semiconductor package according to claim 6, further comprising:
a molding resin that shields a region between an outer periphery of the transparent member and the dam in the upper surface of the transparent member.

9. A semiconductor package, comprising:
a transparent member;
a semiconductor chip in which pixels are arranged on a part of a chip plane, wherein the semiconductor chip includes:
a silicon substrate, and
an organic film formed on a part of a substrate surface of the silicon substrate;
a photosensitive rib that is a photosensitive resin disposed between a region not corresponding to the pixel in the chip plane and the transparent member, wherein the photosensitive rib is disposed between a region of the substrate surface where the organic film is not formed and the transparent member; and
an interposer electrically connected to the semiconductor chip,
wherein the semiconductor chip has an opening, and
wherein a distance from an end of the opening to the organic film is not less than 200 micrometers.

10. The semiconductor package according to claim 9, wherein
the photosensitive rib is formed in close contact with both the transparent member and the semiconductor chip.

11. The semiconductor package according to claim 9, wherein
the transparent member is a lens.

12. The semiconductor package according to claim 9, wherein
a cross-sectional shape of the photosensitive rib is a tapered shape.

13. The semiconductor package according to claim 9, wherein
a shape of an inner wall of the photosensitive rib is a shape obtained by connecting a plurality of triangular prisms with a direction toward the pixel as an inner direction.

14. The semiconductor package according to claim 13, wherein a shape of an outer wall of the photosensitive rib with respect to an inner wall is a shape in which a plurality of triangular prisms is connected.

15. The semiconductor package according to claim 9, further comprising:
a dam; and
a sealing resin that seals the semiconductor chip, the transparent member, and the interposer, wherein
the semiconductor chip is disposed between the transparent member and the interposer, and
the dam is formed around a light receiving region immediately above the pixel on an upper surface of the transparent member where a direction from the interposer to the transparent member is set as an upward direction.

16. The semiconductor package according to claim 15, wherein
a part of the sealing resin shields a region between an outer periphery of the transparent member and the dam in the upper surface of the transparent member.

17. The semiconductor package according to claim 15, further comprising:
a molding resin that shields a region between an outer periphery of the transparent member and the dam in the upper surface of the transparent member.

18. The semiconductor package according to claim 9, further comprising:
an adhesive resin that bonds the photosensitive rib and the semiconductor chip.

19. A semiconductor package, comprising:
a transparent member;
a semiconductor chip in which pixels are arranged on a part of a chip plane;
a photosensitive rib that is a photosensitive resin disposed between a region not corresponding to the pixel in the chip plane and the transparent member; and
an interposer electrically connected to the semiconductor chip,
wherein a shape of an inner wall of the photosensitive rib is a shape obtained by connecting a plurality of triangular prisms with a direction toward the pixel as an inner direction, and
wherein a shape of an outer wall of the photosensitive rib with respect to an inner wall is a shape in which a plurality of triangular prisms is connected.

20. A method for manufacturing a semiconductor package, the method comprising:
a connection procedure of electrically connecting a semiconductor chip in which pixels are arranged on a part of a predetermined chip plane and an interposer;
a photosensitive rib forming procedure of forming a photosensitive resin as a photosensitive rib in a region of one of both surfaces of a transparent member, the region not facing the pixel;
a placement procedure of placing the transparent member on which the photosensitive rib is formed on the semiconductor chip;
an application procedure of applying a resist to the semiconductor chip including a silicon substrate and an organic film formed on a substrate surface of the silicon substrate;
a resist removal procedure of removing a part of the resist; and an organic film removal procedure of removing a portion of the organic film to which the resist is not applied,
wherein the connection procedure is executed after the organic film removal procedure.

* * * * *